US010456860B2

(12) United States Patent
Kyoto et al.

(10) Patent No.: US 10,456,860 B2
(45) Date of Patent: Oct. 29, 2019

(54) LASER BEAM MACHINE AND CALCULATION DEVICE FOR LASER BEAM MACHINE

(71) Applicant: Mitsubishi Electric Corporation, Tokyo (JP)

(72) Inventors: Tomohiro Kyoto, Tokyo (JP); Kenji Kumamoto, Tokyo (JP); Satoshi Nishida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/327,332

(22) PCT Filed: Oct. 25, 2016

(86) PCT No.: PCT/JP2016/081642
§ 371 (c)(1),
(2) Date: Feb. 22, 2019

(87) PCT Pub. No.: WO2018/078730
PCT Pub. Date: May 3, 2018

(65) Prior Publication Data
US 2019/0176264 A1    Jun. 13, 2019

(51) Int. Cl.
*B23K 26/06*    (2014.01)
*H01S 5/042*    (2006.01)
(Continued)

(52) U.S. Cl.
CPC ......... *B23K 26/0665* (2013.01); *B23K 26/00* (2013.01); *H01S 3/00* (2013.01);
(Continued)

(58) Field of Classification Search
CPC ....... B23K 26/00; B23K 26/0665; H01S 3/00; H01S 5/042; H01S 5/062; H01S 5/40; H01S 5/4012; H01S 5/4025
(Continued)

(56) References Cited

U.S. PATENT DOCUMENTS 6,324,195 B1    11/2001    Suzuki et al.
8,599,892 B2 *  12/2013    Senda ................ B23K 26/0613
                                                          372/29.021
(Continued)

FOREIGN PATENT DOCUMENTS

EP    1026795 A2    8/2000
JP    08-171061 A   7/1996
(Continued)

OTHER PUBLICATIONS

Notification of Reasons for Refusal received for Japanese Patent Application No. 2017-513260, dated May 8, 2017, 8 pages including English Translation.
(Continued)

*Primary Examiner* — Dana Ross
*Assistant Examiner* — Ket D Dang
(74) *Attorney, Agent, or Firm* — Xsensus LLP

(57) ABSTRACT

A laser beam machine includes a number of laser modules that each generate a laser beam and a combiner that collects a plurality of laser beams generated from the laser modules to output one laser beam. The laser beam machine further includes a plurality of driving power supplies that supply power to the laser modules, respectively, a calculation device that calculates a driving condition for each of the laser modules according to a received machining condition, and a power-supply control apparatus that causes the driving power supplies to supply power to the laser modules in accordance with the driving condition. The calculation
(Continued)

device controls the power-supply control apparatus to reduce differences in integrated laser-output times of the laser beams generated by the laser modules.

12 Claims, 18 Drawing Sheets

(51) Int. Cl.
  H01S 5/40       (2006.01)
  B23K 26/00      (2014.01)
  H01S 5/062      (2006.01)
  H01S 3/00       (2006.01)

(52) U.S. Cl.
  CPC .............. H01S 5/042 (2013.01); H01S 5/062 (2013.01); H01S 5/40 (2013.01); H01S 5/4012 (2013.01); H01S 5/4025 (2013.01)

(58) Field of Classification Search
  USPC ........... 219/121.61; 372/38.02, 29.021, 38.1, 372/38.01, 38.07, 29.015, 29.014
  See application file for complete search history.

(56) References Cited

U.S. PATENT DOCUMENTS

| | | | |
|---|---|---|---|
| 9,343,865 B2 | 5/2016 | Miyato et al. | |
| 2002/0000426 A1 | 1/2002 | Mead et al. | |
| 2010/0033508 A1* | 2/2010 | Mizushima | G09G 3/3406 345/690 |
| 2015/0229095 A1 | 8/2015 | Miyato et al. | |
| 2015/0375337 A1* | 12/2015 | Hayashi | B23K 26/38 219/121.61 |
| 2018/0097336 A1 | 4/2018 | Tsuda et al. | |

FOREIGN PATENT DOCUMENTS

| | | | |
|---|---|---|---|
| JP | 2000-208798 A | | 7/2000 |
| JP | 2000208798 A | * | 7/2000 |
| JP | 2000-223765 A | | 8/2000 |
| JP | 2002-076479 A | | 3/2002 |
| JP | 2003-273435 A | | 9/2003 |
| JP | 2006-047471 A | | 2/2006 |
| JP | 2011-187825 A | | 9/2011 |
| JP | 2014-082307 A | | 5/2014 |
| JP | 5729107 B2 | | 6/2015 |
| WO | 2014/061662 A1 | | 4/2014 |
| WO | 2016/167019 A1 | | 10/2016 |

OTHER PUBLICATIONS

Notification of Reasons for Refusal received for Japanese Patent Application No. 2017-513260, dated Aug. 14, 2017, 7 pages including English Translation.

Decision to Grant a Patent received for Japanese Patent Application No. 2017-513260, dated Nov. 7, 2017, 6 pages including English Translation.

International Search Report dated Dec. 27, 2016 for PCT/JP2016/081642 filed on Oct. 25, 2016, 9 pages including English Translation.

* cited by examiner

| IDENTIFICATION NUMBER OF LASER MODULE | UNIQUE NUMBER OF LASER MODULE |
|---|---|
| 1 | 2 |
| 2 | 3 |
| 3 | 4 |
| 4 | 1 |

OI'

| IDENTIFICATION NUMBER OF LASER MODULE | UNIQUE NUMBER OF LASER MODULE |
|---|---|
| 1 | 1 |
| 2 | 2 |
| 3 | 4 |
| 4 | 3 |

| IDENTIFICATION NUMBER OF LASER MODULE | UNIQUE NUMBER OF LASER MODULE |
|---|---|
| 1 | 1 |
| 2 | 2 |
| 3 | 4 |
| 4 | 3 |

| IDENTIFICATION NUMBER OF LASER MODULE | UNIQUE NUMBER OF LASER MODULE |
|---|---|
| 1 | 1 |
| 2 | 2 |
| 3 | 3 |
| 4 | 4 |

OI-2

LASER BEAM MACHINE AND CALCULATION DEVICE FOR LASER BEAM MACHINE

CROSS-REFERENCE TO RELATED APPLICATIONS

The present application is based on PCT filing PCT/JP2016/081642, filed Oct. 25, 2016, which is incorporated herein by reference.

FIELD

The present invention relates to a laser beam machine that performs laser machining on a workpiece, and a calculation device for the laser beam machine.

BACKGROUND

As a laser beam machine that irradiates a workpiece with a laser beam, there is used a laser beam machine that includes a plurality of laser modules that generates their respective laser beams, and a combiner that collects the laser beams generated by the laser modules to output one laser beam (See Patent Literatures 1, 2, and 3).

CITATION LIST

Patent Literature

Patent Literature 1: Japanese Patent Application Laid-open No. 2006-47471
Patent Literature 2: Japanese Patent Application Laid-open No. 2003-273435
Patent Literature 3: Japanese Patent No. 5729107

SUMMARY

Technical Problem

The laser beam machines disclosed in Patent Literatures 1 and 2 each are designed to generate laser beams having the same level output from all the laser modules at the time of machining. For this reason, when all the laser modules are operated to output a low-output laser beam in the laser beam machine, the laser modules are in operation around the laser oscillation threshold, so that the resultant laser beam is unstable and the reliability of the laser machining is deteriorated, thereby causing a problem.

In addition, in the laser beam machines disclosed in Patent Literatures 1 and 2, the wavelengths of the laser beams generated by the laser modules are different from each other, and thereby some particular laser modules have sometimes been in heavy usage depending on a machining condition. In this case, the laser beam machines have a problem in that aged deterioration of the particular laser modules tends accelerate.

The laser beam machine disclosed in Patent Literature 3 includes a selection-condition determination unit for reducing the number of laser modules to be driven according to a machining condition without driving all the laser modules. However, this machine has a problem in that some particular laser modules are heavily used, and so aged deterioration thereof accelerates.

The present invention has been made in view of the above circumstances, and its object is to provide a laser beam machine capable of suppressing aged deterioration of a particular laser module.

Solution to Problem

In order to solve the above-mentioned problems and achieve the object, the present invention is a laser beam machine that irradiates a workpiece with a laser beam to perform laser machining. The laser beam machine comprises: a plurality of laser modules to generate the laser beam; and a light condensing unit to condense laser beams generated from the laser modules to output one laser beam. The laser beam machine comprises: a plurality of driving power supplies to supply power to the laser modules, respectively; a calculation device to receive a machining condition and to calculate a driving condition for each of the laser modules according to the machining condition; and a power-supply control apparatus to cause the driving power supplies to supply power to the laser modules in accordance with the driving condition. The calculation device controls the power-supply control apparatus to reduce differences in integrated laser-output times of the laser beams generated by the laser modules.

Advantageous Effects of Invention

A laser beam machine according to the present invention has an advantageous effect of suppressing aged deterioration of a particular laser module.

DESCRIPTION OF EMBODIMENTS

Hereinafter, a laser beam machine and a calculation apparatus for the laser beam machine according to embodiments of the present invention are described in detail with reference to the drawings. Note that, the invention is not necessarily limited by these embodiments.

First Embodiment

Figure 1:
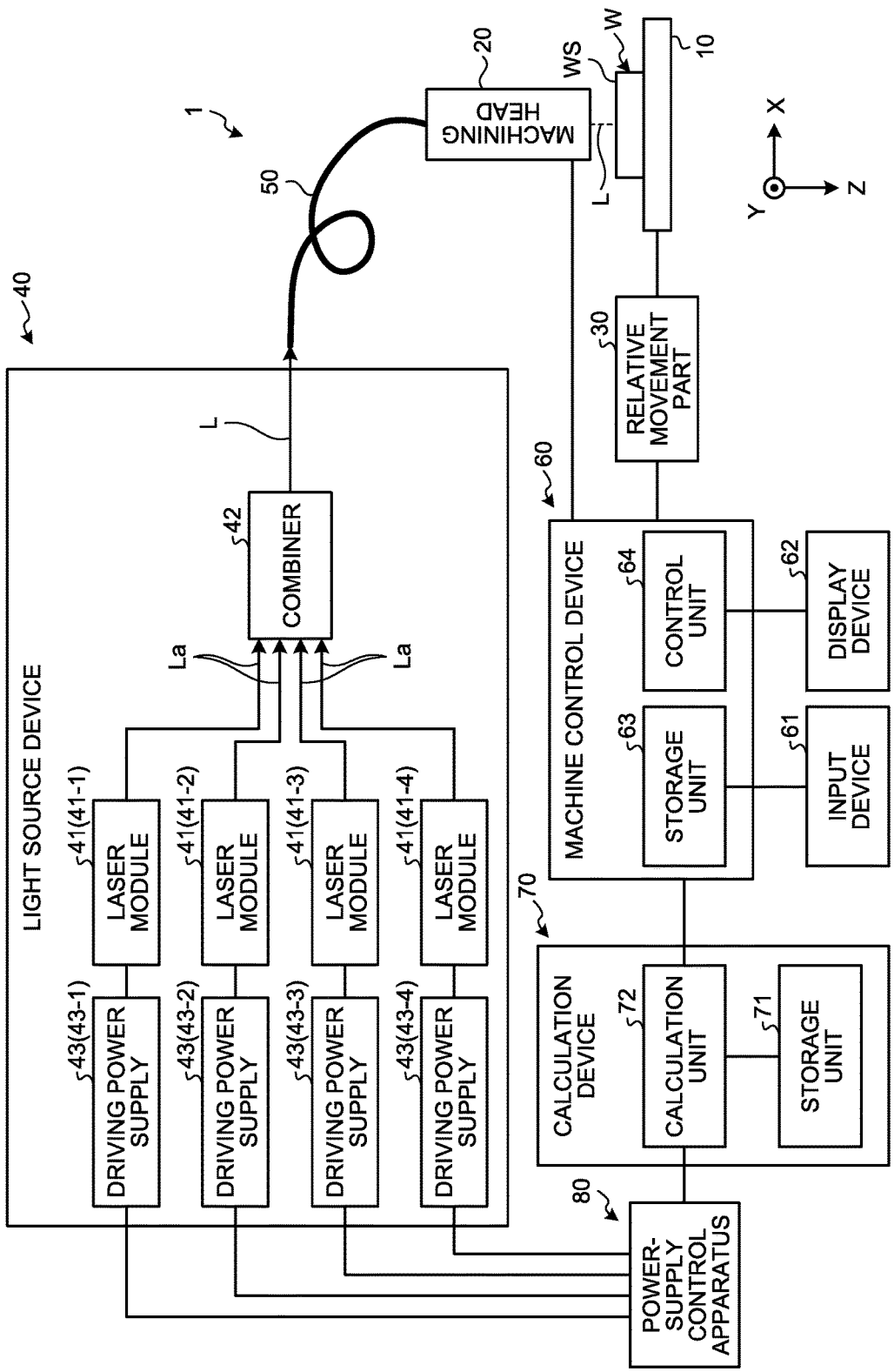
FIG. 1 is a diagram illustrating a configuration of a laser beam machine according to a first embodiment.
Figure 2:
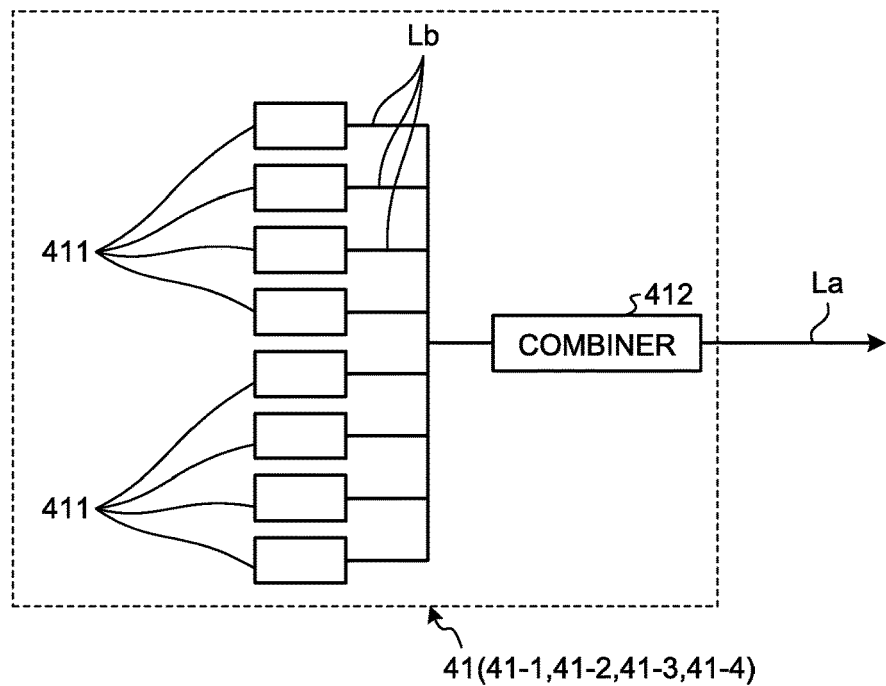
FIG. 2 is a diagram illustrating a configuration of each laser module of the laser beam machine illustrated in FIG. 1.

FIG. 1 is a diagram illustrating a configuration of a laser beam machine according to a first embodiment. FIG. 2 is a diagram illustrating a configuration of each laser module of the laser beam machine illustrated in FIG. 1.

A laser beam machine 1 illustrated in FIG. 1 irradiates a workpiece W with a laser beam L to perform laser machining on the workpiece W. In the first embodiment, the laser beam machine 1 is a device that irradiates the workpiece W with the laser beam L to subject the workpiece W to laser beam machining to cut the workpiece into parts and remaining materials by performing laser machining to the workpiece W. In the first embodiment, the workpiece W to be machined by the laser beam machine 1 is made of a metal material and formed in a flat plate shape.

As illustrated in FIG. 1, the laser beam machine 1 includes a workpiece supporting part 10 that supports the workpiece W, a machining head 20 that irradiates the workpiece W with the laser beam L, and a relative movement part 30 that relatively displaces the workpiece supporting part 10 and the machining head 20. The laser beam machine 1 further includes a light source device 40 that generates a laser beam L, an optical fiber 50 that guides the laser beam L generated by the light source device 40 to the machining head 20, a machine control device 60 that receives a machining condition, a calculation device 70 that calculates a driving condition of each of a number of laser modules 41 used in the light source device 40, and a power-supply control apparatus 80 that controls driving power supplies 43 used in the light source apparatus 40.

The relative movement part 30 is capable of relatively moving the machining head 20 and the workpiece supporting part 10 in an X direction that is along a surface WS of the workpiece W facing the machining head 20, and capable of relatively moving the machining head 20 and the workpiece supporting part 10 in a Y direction that intersects the X direction. The relative movement part 30 is capable of relatively displacing the machining head 20 and the workpiece supporting part 10 in a Z direction that is along a thickness direction of the workpiece W. In the first embodiment, the X direction, the Y direction, and the Z direction are orthogonal to one another. In the first embodiment, the relative movement part 30 is capable of moving the workpiece supporting part 10 in the X direction, in the Y direction, and in the Z direction.

The light source device 40 includes a plurality of laser modules 41, a combiner 42 that is a light condensing means, and a plurality of driving power supplies 43. The laser modules 41 each generate a laser beam La. The laser modules 41 generate laser beams La having their respective wavelengths equal to each other. In the first embodiment, four laser modules 41 are provided, but the number of laser modules 41 is not limited to four. In the first embodiment, when the four laser modules are distinguished from one another, the four laser modules 41 are described as a first laser module 41-1, a second laser module 41-2, a third laser module 41-3, and a fourth laser module 41-4. The numerals "1", "2", "3", and "4" after "–" in the laser modules 41-1, 41-2, 41-3, and 41-4 are unique numbers of the laser modules 41. The unique number is a unique number assigned to each laser module 41 and is not changed.

As illustrated in FIG. 2, the laser modules 41 each include a plurality of semiconductor lasers 411 each generating a laser beam Lb, and a combiner 412.

The semiconductor lasers 411 each generate a laser beam Lb. In the first embodiment, the semiconductor lasers 411 are semiconductor laser packages. The semiconductor laser package is a unified object of a semiconductor laser mounted on a heat sink. The combiner 412 condenses a plurality of laser beams Lb generated from the semiconductor lasers 411 to form output of one laser beam La.

In the first embodiment, the laser modules 41 may be configured such that the wavelengths of the laser beams Lb generated by all the semiconductor lasers 411 are equal, or such that the wavelengths of the laser beams Lb generated by all the semiconductor lasers 411 are different from each other. In the first embodiment using the laser modules 41, the combiners 412 have their configurations equal to each other. In the laser modules 41, the wavelengths of the laser beams Lb generated by the semiconductor lasers 411 are set to be equal to each other, and the combiners 412 are configured to have configurations equal to each other, thereby to generate the laser beams La having their wavelengths equal to each other.

The combiner 42 condenses the laser beams La generated from the laser modules 41 to form output of one laser beam L.

The driving power supplies 43 are provided corresponding to the respective laser modules 41. The driving power supplies 43 correspond to the laser modules 41 on a one-to-one basis. The driving power supply 43 supplies power to the semiconductor lasers 411 of the corresponding laser module 41 so as to cause the laser module 41 to generate the laser beam La. Note that, when the driving power supplies 43 are distinguished from each other for their description, the reference signs 43-1, 43-2, 43-3, and 43-4 are given to the power supplies in this specification.

The one laser beam L outputted from the combiner 42 is led to a second end of the optical fiber 50 whose first end is connected to the machining head 20.

The machine control device 60 includes at least a computer. The machine control device 60 controls the relative movement part 30 and the machining head 20 and controls, through the calculation device 70 and the power-supply control apparatus 80, the driving power supplies 43 to perform laser machining on the workpiece W. The machine control device 60 relatively moves the machining head 20 and the workpiece W along the X direction and the Y direction when performing laser machining on the workpiece W.

The machine control device 60 is connected to an input device 61. The input device 61 is intended to input information about the laser beam machine 1, position information indicating the position of each part of the workpiece W, a machining program at the time of machining, and a machining condition. The machine control device 60 receives the information about the laser beam machine 1, the position information indicating the position of each part of the workpiece W, the machining program at the time of machining, and the machining condition, which are inputted from the input device 61.

The information about the laser beam machine 1 corresponds to at least one of the number of laser modules 41 of the light source device 40, the maximum output of a laser beam L of the light source device 40, the minimum output of the laser beam L of the light source device 40, the maximum output of the laser beam La of each laser module 41, the minimum output of the laser beam La of each laser module 41, the maximum repetition frequency of the laser beam L of the light source device 40, the maximum repetition frequency of the laser beam La of each laser module 41, the determination output of output laser module number of the light source device 40, and the temperature time constant of the semiconductor lasers 411 of each laser module 41 of the light source device 40.

The maximum output of the laser beam L or La of the light source device 40 or the laser module 41 means the maximum laser output at which the light source device 40 or the laser module 41 can generate the laser beam. The minimum output of the laser beam La of the laser module 41 means the minimum laser output at which the laser module 41 can generate the laser beam.

Figure 3:
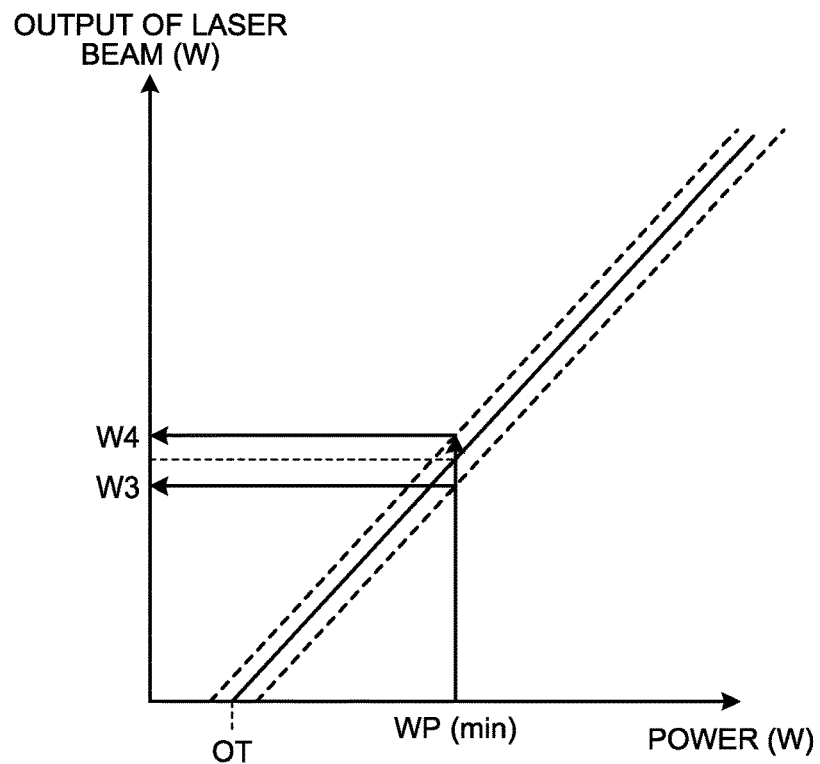
FIG. 3 is a graph illustrating the relationship between the applied power and output power of a laser beam of a laser module of a light source apparatus of the laser beam machine according to the first embodiment.

The minimum laser output at which each laser module 41 can generate the laser beam is preset according to variations in the allowable output of the laser beam La. FIG. 3 is a graph illustrating the relationship between the applied power of each laser module of the light source device of the laser beam machine according to the first embodiment and the output power of the laser beam therefrom.

According to FIG. 3, the laser module 41 generates a laser beam La when the applied electric power exceeds an oscillation threshold OT, and when an electric power exceeding the oscillation threshold OT is applied, the output of the laser beam La increases according to the increase in the power. Furthermore, since the oscillation threshold OT of the laser module 41 varies according to the individual difference and adjustment state of components, the output of the laser beam La results in varying as illustrated by a broken line in FIG. 3. For this reason, a variation $\sigma$ in the output of the laser beam La can be expressed by the following Formula 1 when the power applied to the laser module 41 is WP(min), the maximum value of the variation in the output of the laser beam La at the time of application of the power WP(min) is W4, and the minimum value at the time of the same is W3.

$$\sigma=((W4-W3)/(W3+W4)) \qquad \text{Formula 1}$$

According to Formula 1, by setting the allowable variation $\sigma$ in the output of the laser beam La in advance, it is possible to set the minimum power WP(min) that can be applied to the laser module 41, that is, the minimum output of the laser beam La of the laser module 41. In the first embodiment, since each laser module 41 independently outputs the laser beam La in the light source device 40, the minimum output of the laser module 41 is equal to the minimum output of the laser beam L of the light source device 40.

The repetition frequency of the laser beam L of the light source device 40 means a repetition frequency of pulsed voltages applied to the laser modules 41 by the driving power supplies 43 of the entire light source device 40 when the light source device 40 generates a pulsed laser beam L. The repetition frequency of the laser beam La of the laser module 41 means a repetition frequency of a pulsed voltage applied to each laser module 41 by each driving power supply 43 when a pulsed laser beam L is generated.

The determination output of output laser module number of the light source device 40 is an output for determining whether the two or more laser modules 41 simultaneously generate the laser beams La or each laser module 41 generates the laser beam La at a different timing from the other. In the first embodiment, the determination output of output laser module number of the light source device 40 means an output of the laser beam L of the light source device 40 when all the laser modules 41 generate the minimum output laser beams La. The determination output of output laser module number of the light source device 40 corresponds to a value obtained by multiplying the minimum output of each laser module 41 by the number of laser modules 41. The temperature time constant of the semiconductor laser 411 means a time length required from the temperature in a state where the power is supplied to the semiconductor laser 411 and the laser beam La is generated to a low temperature in a steady state where the supply of power is stopped.

The machining condition corresponds to any of the beam-on timing at which irradiation with the laser beam L is started, the beam-off timing at which the irradiation with the laser beam L is stopped, the output level of the laser beam L, the repetition frequency of the laser beam L, the duty ratio of the laser beam L, the focus position of the laser beam L, and the distance between the machining head 20 and the workpiece W at the time of machining. The beam-on timing is, for example, a time point to start irradiation with the laser beam L, and the beam-off timing is, for example, a time point to stop the irradiation with the laser beam L. At least one beam-on timing and at least one beam-off timing are included in the machining condition. The beam-on timings and the beam-off timings which are the same in number are included in the machining condition. The duty ratio of the laser beam L represents a ratio of the irradiation time with the laser beam L per unit time in percent figures. The machine control device 60 is further connected with a display device 62 that displays a position or the like of each part of the workpiece W.

The machine control device 60 includes a storage unit 63 that stores the information about the laser beam machine 1, the position information of each part, the machining program, and the machining conditions, and a control unit 64 that controls the relative movement part 30 and the machining head 20 at the time of machining in accordance with the position information of each part, the machining program, and the machining condition. The machine control device 60 transmits the received information about the laser beam machine 1 to the calculation device 70. The machine control device 60 transmits, to the calculation apparatus 70, the beam-on timing, the beam-off timing, the output level of the laser beam L, the repetition frequency of the laser beam L, and the duty ratio of the laser beam L, which are each a partial machining condition of the received machining conditions.

Figure 4:
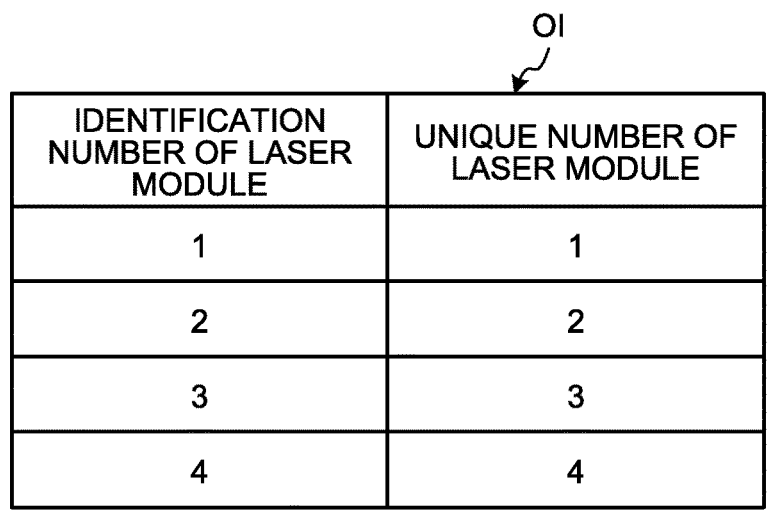
FIG. 4 is a diagram illustrating an example of power-supplying order information stored in a storage unit of a calculation apparatus of the laser beam machine according to the first embodiment.

The calculation device 70 is a computer. The calculation device 70 receives, through the machine control device 60, the information about the laser beam machine 1 and a part of the machining conditions. The calculation device 70 calculates the driving condition of each laser module 41 according to the information about the laser beam machine 1, the received machining condition, and power-supplying order information OI illustrated in FIG. 4. The calculation device 70 includes a storage unit 71 that stores a program for calculating the driving condition of each of the laser modules 41 based on the information about the laser beam machine 1, the machining condition, and the power-supplying order information OI, and a calculation unit 72 that calculates the driving condition of each of the laser modules 41 based on the information about the laser beam machine 1 and the machining condition. Note that, FIG. 4 is a diagram illustrating an example of the power-supplying order information stored in the storage unit of the calculation device of the laser beam machine according to the first embodiment.

The driving condition corresponds to the number of laser modules 41 that generate the laser beams La, the output level of each laser module 41, the repetition frequency of each laser module 41, the application time for generating the pulsed laser beam La of each laser module 41, the delay time of each laser module 41 from the generation of a clock pulse of the power-supply control apparatus 80 to the start of the application, and the order of power supply to the laser modules 41. The calculation device 70 transmits the calculated driving condition to the power-supply control apparatus 80.

In the laser beam machine 1, each of the laser modules 41 has an identification number representing the order of power supply to the laser modules 41, that is, the order of generation of the laser beams La, and the power-supplying order information OI is set to associate the identification number of each laser module 41 with the unique number of each laser module 41 on a one-to-one basis. For example, natural numbers in ascending order from 1 are used for the identification numbers, and the power-supplying order information OI indicates that power is sequentially supplied to the laser modules 41 from the laser module 41 having the smallest identification number. The power-supplying order information OI is stored in the storage unit 71 that is a recording device. The calculation unit 72 sets the order of power supply to the laser modules 41, that is, the order of generation of the laser beams La to the order represented by the power-supplying order information OI, that is, the order of the identification numbers of the laser modules 41. Note that, the power-supplying order information OI illustrated in FIG. 4 indicates that the power is firstly supplied to the first laser module 41-1 having the unique number "1", the power is next supplied to the second laser module 41-2 having the unique number "2", then the power is supplied to the third laser module 41-3 having the unique number "3", and subsequently the power is supplied to the fourth laser module 41-4 having the unique number "4".

The calculation unit 72 supplies the power to each of the laser modules 41 in order of the identification numbers indicated in the power-supplying order information OI repeatedly. After the last beam-off timing ends, the calculation unit 72 records the integrated laser-output time that is an amount of time for which the laser beam La of each of the laser modules 41 is generated, in the storage unit 71, rearranges the identification numbers of the laser modules 41 in ascending order of the integrated laser-output times to produce new power-supplying order information OI, and records the new power-supplying order information OI in the storage unit 71. In the rearrangement, the calculation unit 72 sequentially gives identification numbers from the smallest number to the laser modules 41 in ascending order of the integrated laser-output times. When there are two or more laser modules 41 having equal lengths of the integrated laser-output times, the calculation unit 72 gives a smaller identification number to one of the laser modules 41 which has a smaller unique number. The integrated laser-output time is a value obtained by accumulating the amounts of time for which each laser module 41 generates the laser beam La.

The power-supply control apparatus 80 is connected to the driving power supplies 43 and causes the driving power supplies 43 to supply power to the laser modules 41 in accordance with the driving condition calculated by the calculation device 70. The power-supply control apparatus 80 includes a clock generation circuit that generates a clock pulse, and causes the driving power supplies 43 to supply power to the laser modules 41 based on the clock pulse generated by the clock generation circuit, the application time, the delay time, and the order of power supply to the laser modules 41. Note that, the clock generation circuit of the power-supply control apparatus 80 starts generation of a clock pulse for each given time determined by the beam-on timing and terminates the generation of the clock pulse at the beam-off timing.

Figure 5:
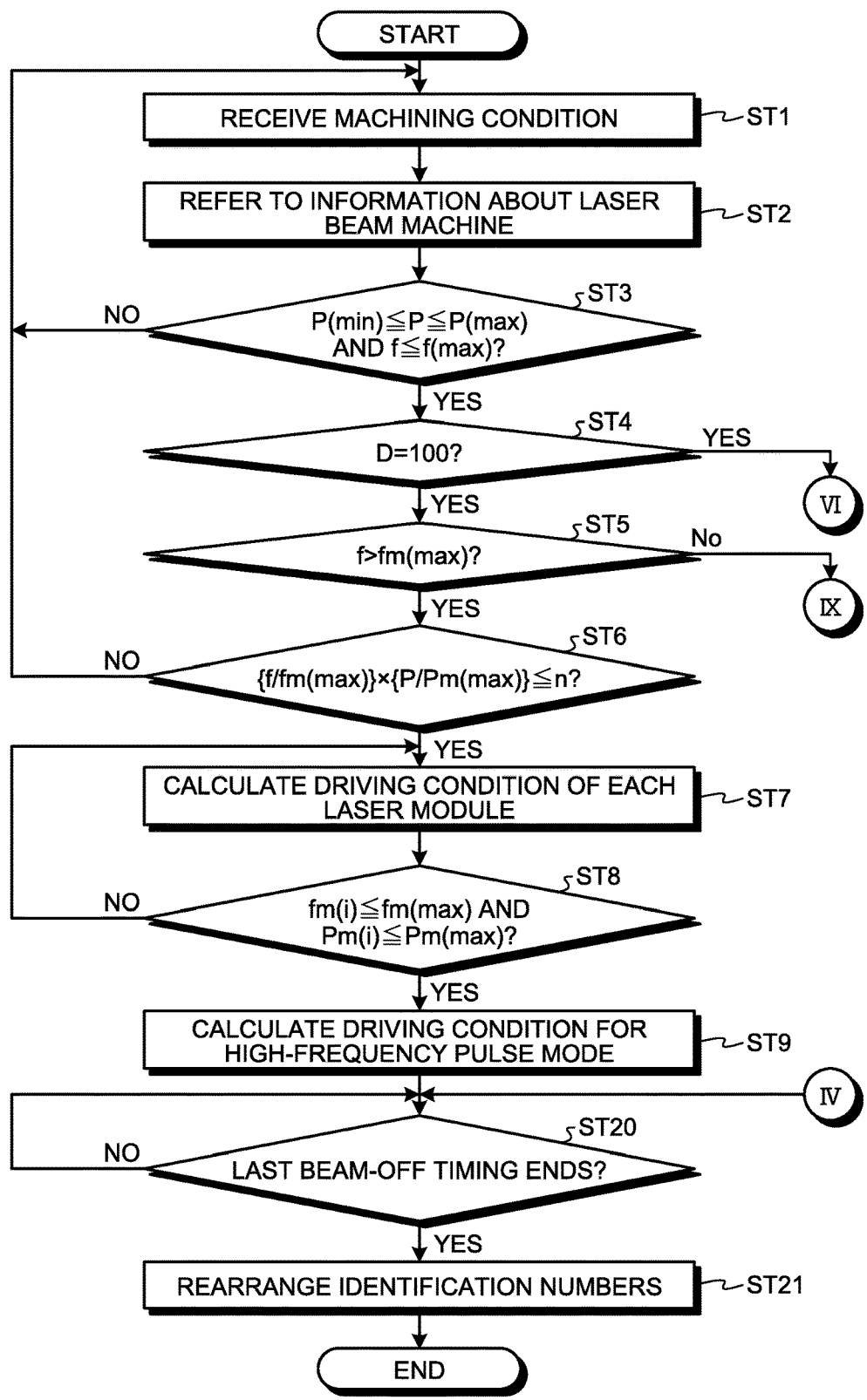
FIG. 5 is a flowchart illustrating a part of a process for calculating a driving condition in the calculation apparatus of the laser beam machine according to the first embodiment.
Figure 6:
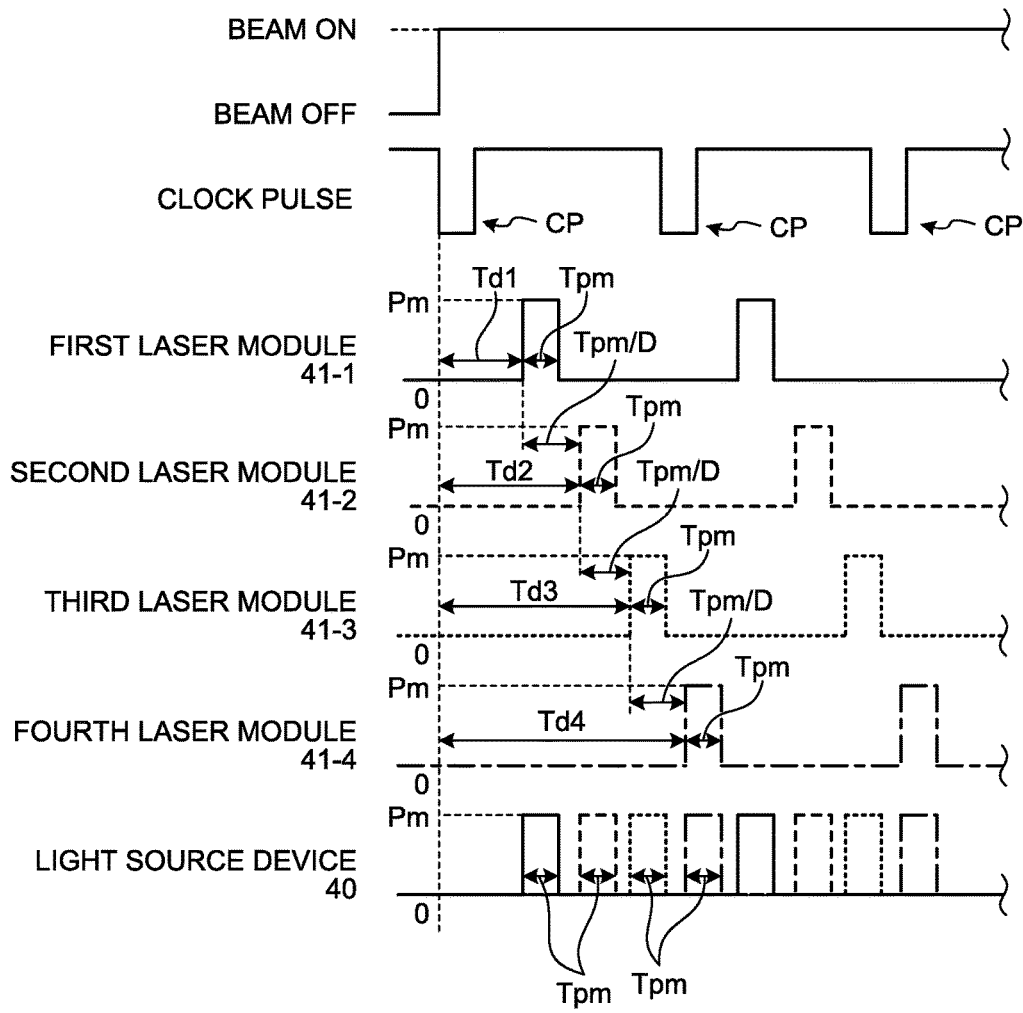
FIG. 6 is a chart illustrating the driving condition calculated in step ST9 illustrated in FIG. 5.
Figure 7:
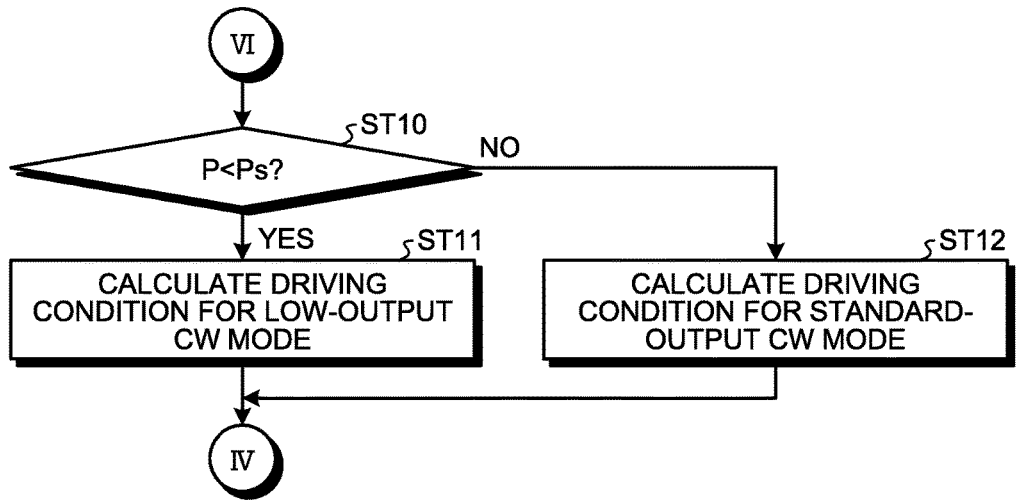
FIG. 7 is a flowchart illustrating another part of the process for calculating the driving condition in the calculation apparatus of the laser beam machine according to the first embodiment.
Figure 8:
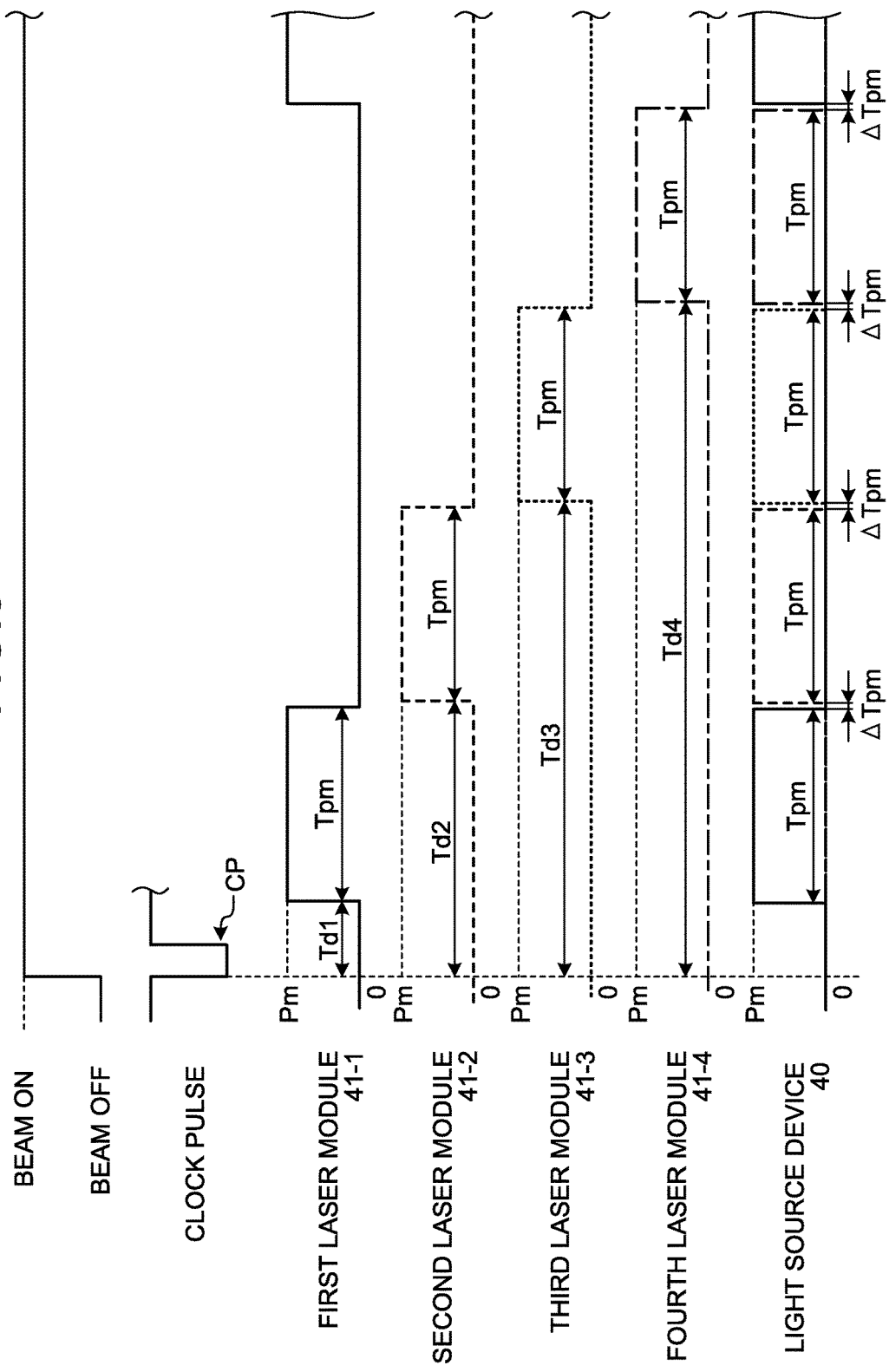
FIG. 8 is a chart illustrating the driving condition calculated in step ST11 illustrated in FIG. 7.
Figure 9:
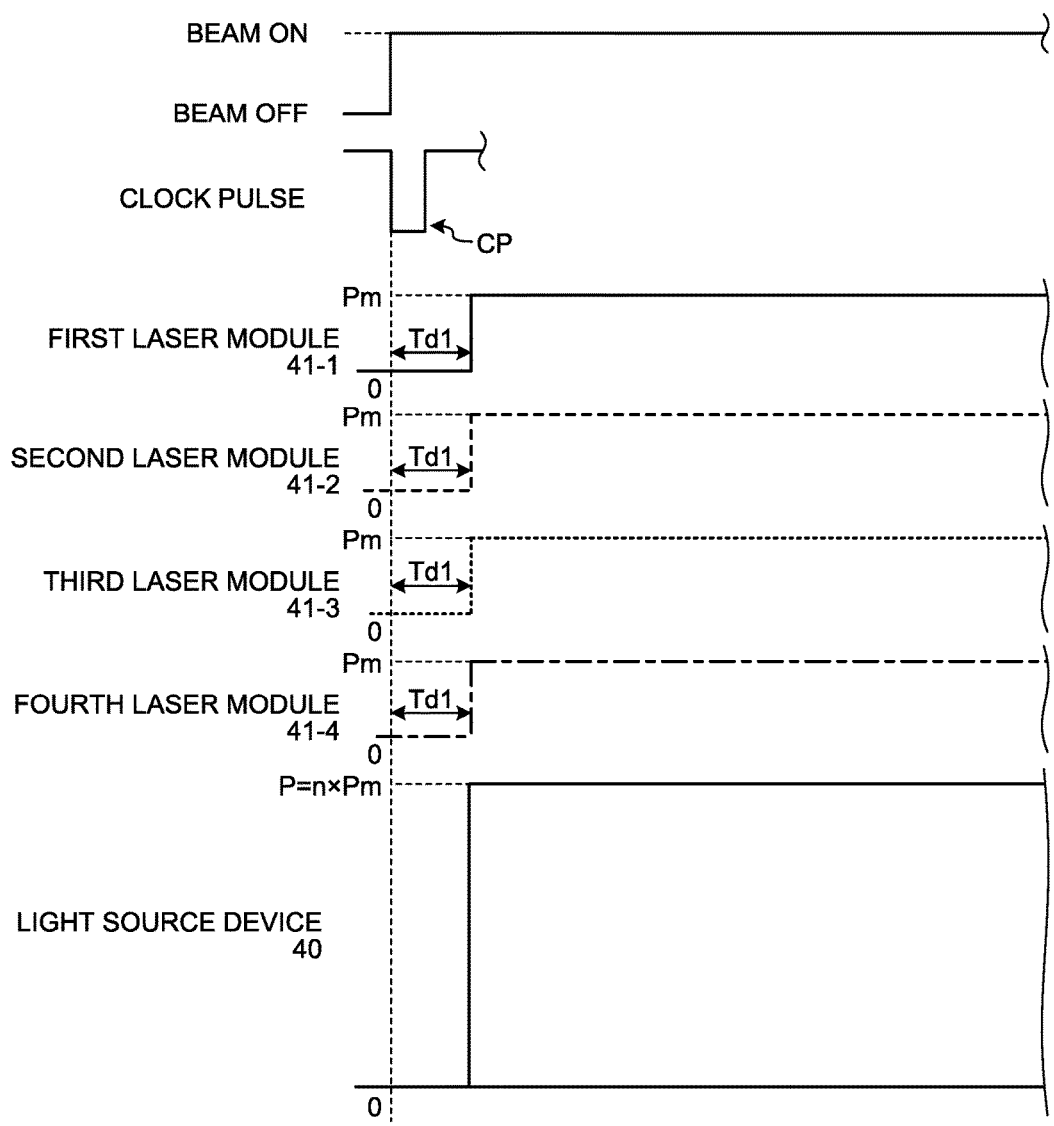
FIG. 9 is a diagram illustrating the driving condition calculated in step ST12 illustrated in FIG. 7.
Figure 10:
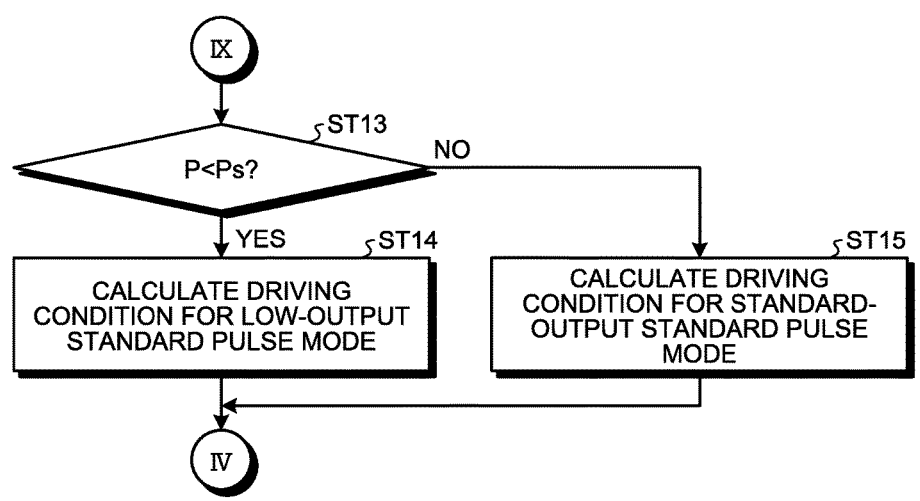
FIG. 10 is a flowchart illustrating another part of the process for calculating the driving condition in the calculation apparatus of the laser beam machine according to the first embodiment.
Figure 11:
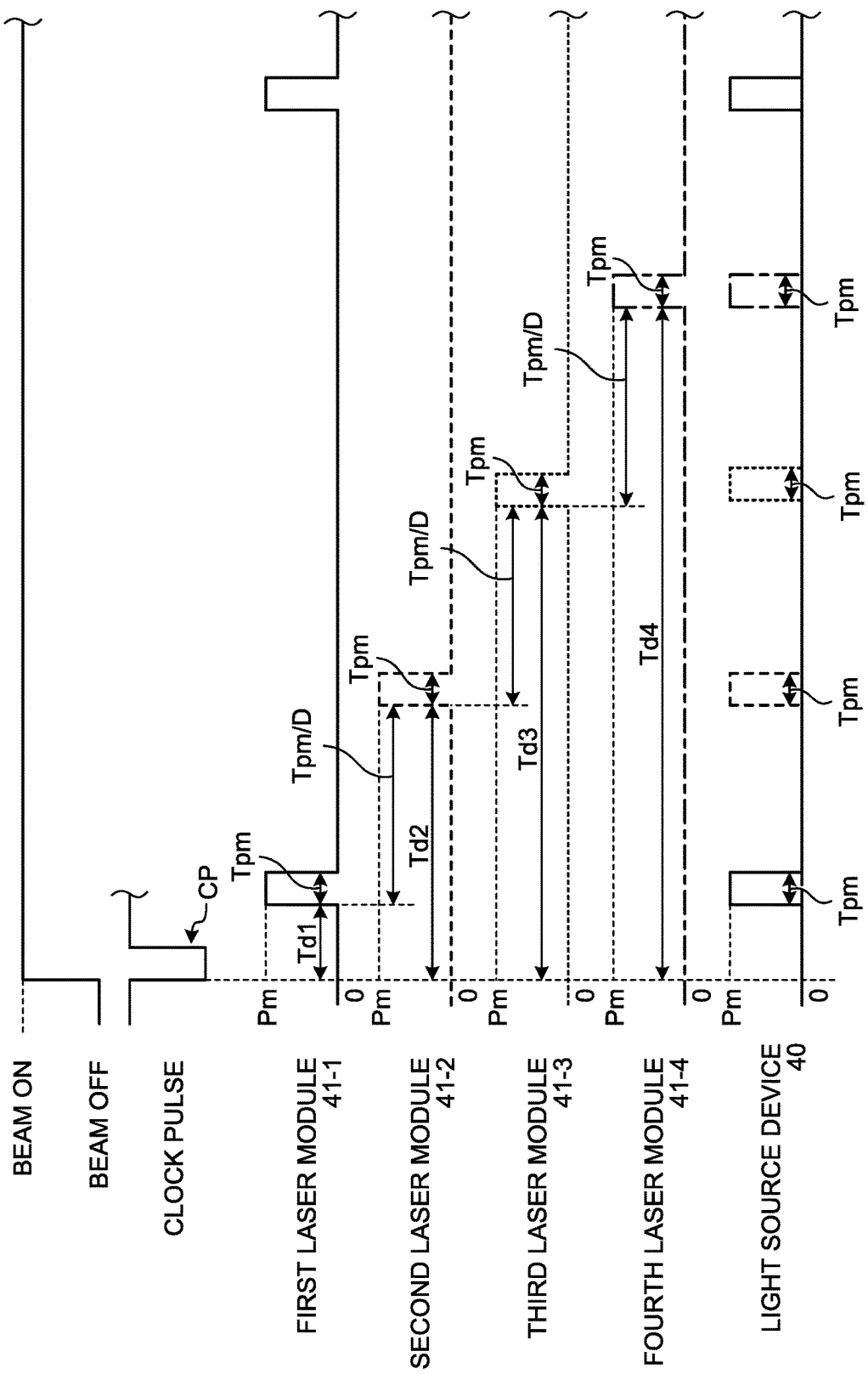
FIG. 11 is a chart illustrating the driving condition calculated in step ST14 illustrated in FIG. 10.
Figure 12:
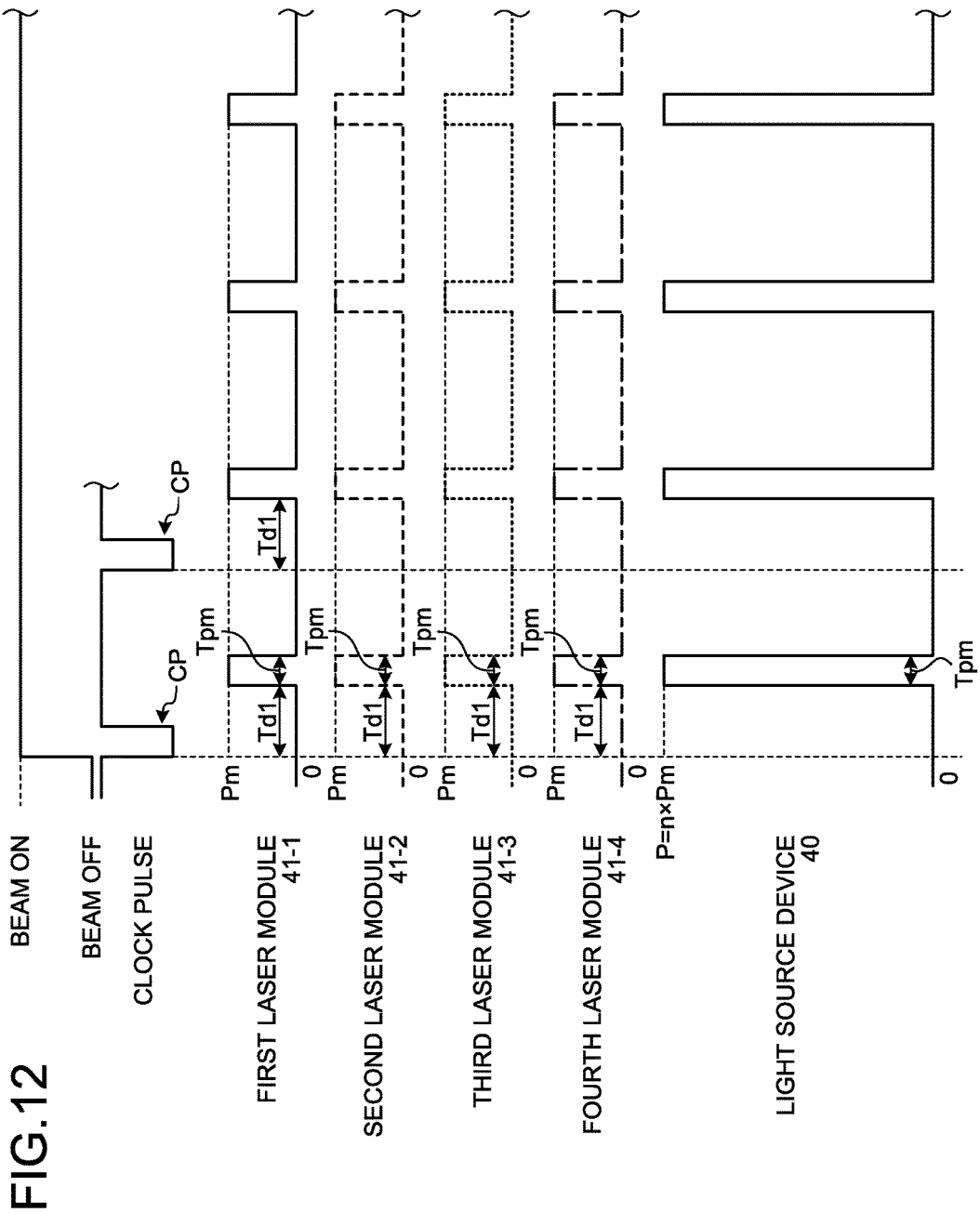
FIG. 12 is a chart illustrating the driving condition calculated in step ST15 illustrated in FIG. 10.

Next, description is given for the process in which the calculation device 70 of the laser beam machine 1 according to the first embodiment calculates the driving condition of each of the laser modules 41. FIG. 5 is a flowchart illustrating a part of process in which the calculation device of the laser beam machine according to the first embodiment calculates the driving condition. FIG. 6 is a chart illustrating the driving condition calculated in step ST9 illustrated in FIG. 5. FIG. 7 is a flowchart illustrating another part of the process in which the calculation device of the laser beam machine according to the first embodiment calculates the driving condition. FIG. 8 is a chart illustrating the driving condition calculated in step ST11 illustrated in FIG. 7. FIG. 9 is a chart illustrating the driving condition calculated in step ST12 illustrated in FIG. 7. FIG. 10 is a flowchart illustrating another part of the process in which the calculation device of the laser beam machine according to the first embodiment calculates the driving condition. FIG. 11 is a chart illustrating the driving condition calculated in step ST14 illustrated in FIG. 10. FIG. 12 is a chart illustrating the driving condition calculated in step ST15 illustrated in FIG. 10.

The machining condition is inputted from the input device 61 to the machine control device 60, and the calculation device 70 receives a part of the machining condition (step ST1). The calculation device 70 refers to the information about the laser beam machine 1 stored in the storage unit 71 (step ST2). The calculation device 70 sets the maximum output of the laser beam L of the light source device 40 to P(max), the minimum output of the laser beam L of the light source device 40 to P(min), the maximum repetition frequency of the laser beam L of the light source device 40 to f(max), the output of the laser beam L defined in the machining condition to P, and the repetition frequency of the laser beam L defined in the machining conditions to f, and the device 70 determines whether both Formulas 2 and 3 are satisfied (step ST3).

$$P(\min) \leq P \leq P(\max) \qquad \text{Formula 2}$$

$$f \leq f(\max) \qquad \text{Formula 3}$$

When determining that at least one of Formulas 2 and 3 is not satisfied (step ST3: No), the calculation device 70 returns to step ST1 to receive the machining condition again. When determining that both Formulas 2 and 3 are satisfied (step ST3: Yes), the calculation device 70 sets the duty ratio defined in the machining condition to D and determines whether or not the following Formula 4 is satisfied (step ST4).

$$D = 100 \qquad \text{Formula 4}$$

When determining that Formula 4 is not satisfied (step ST4: No), the calculation device 70 sets the maximum repetition frequency of the laser beam La of each laser module 41 to fm(max) and determines whether or not the following Formula 5 is satisfied (step ST5).

$$f > fm(\max) \qquad \text{Formula 5}$$

When determining that Formula 5 is satisfied (step ST5: Yes), the calculation device 70 determines that the repetition frequency f of the laser beam L defined in the machining condition exceeds the maximum repetition frequency fm(max) at which the laser beam La of each of the laser modules 41 can be repeatedly generated and calculates a driving condition for a high-frequency pulse mode. The high-frequency pulse mode is a mode in which two or more laser modules 41 among the laser modules 41 are caused to generate the laser beams La with a time difference according to the repetition frequency f defined in the machining condition to generate the laser beam L at the repetition frequency f defined in the machining condition. That is, the high-frequency pulse mode is a mode for performing irradiation at the repetition frequency f defined in the machining condition with the laser beam L based on the laser beams La generated with a time difference by two or more laser modules 41 among the laser modules 41.

The calculation device 70 sets the number of laser modules 41 of the light source device 40 to n and the maximum output of the laser beam La of each laser module 41 to Pm(max), and determines whether or not the following Formula 6 is satisfied (step ST6).

$$\{f/fm(\max)\} \times \{P/Pm(\max)\} \leq n \qquad \text{Formula 6}$$

Formula 6 represents whether or not the repetition frequency f of the laser beam L and the output P of the laser beam L, which are defined in the machining condition, can be realized by the light source device 40. When determining that Formula 6 is not satisfied (step ST6: No), which means that the repetition frequency f of the laser beam L and the output P of the laser beam L, which are defined in the machining condition, cannot be realized by the light source device 40, the calculation device 70 returns to step ST1 and receives the machining condition again.

When determining that Formula 6 is satisfied (step ST6: Yes), which means that the repetition frequency f of the laser beam L and the output P of the laser beam L, which are defined in the machining condition, can be realized by the light source device 40, the calculation device 70 calculates the driving condition of each of the laser modules 41 (step ST7). The output of the laser beam La of each laser module 41 is set to Pm(i), the repetition frequency of the laser beam La of each laser module 41 is set to fm(i), with i=1 set, and then the output Pm(i) and the repetition frequency fm(i) of each laser module 41 are calculated using the following Formulas 7 and 8.

$$Pm(i) = P/i \qquad \text{Formula 7}$$

$$fm(i) = f \times i/n \qquad \text{Formula 8}$$

The calculation device 70 determines whether or not the repetition frequency fm(i) and the output Pm(i) of each laser module 41 calculated in step ST7 satisfy both of the following Formulas 9 and 10 (Step ST8).

$$fm(i) \leq fm(\max) \qquad \text{Formula 9}$$

$$Pm(i) \leq Pm(\max) \qquad \text{Formula 10}$$

When determining that the output Pm(i) and the repetition frequency fm(i) of each laser module 41 calculated in step ST7 does not satisfy either one of Formulas 9 and 10 (step ST8: No), the calculation device 70 returns to step ST7, and repeats steps ST7 and ST8 with i=i+1 up to i=n until both Formulas 9 and 10 are satisfied (step ST8: Yes).

When determining that the output Pm(i) and the repetition frequency fm(i) of each laser module 41 calculated in step ST7 satisfy both Formulas 9 and 10 (step ST8: Yes), the calculation device 70 calculates the driving condition for the high-frequency pulse mode (step ST9).

In step ST9, the calculation device 70 sets q=i and sets q to be the number of laser modules 41 that generate the laser beams La at the same timing in order to satisfy the machining condition. In step ST9, the calculation device 70 sets the order of power supply to the laser modules 41 to the order indicated in the power-supplying order information OI. In step ST9, the calculation device 70 sets the output of each laser module 41 that generates the laser beam La to Pm, the repetition frequency of each laser module 41 that generates the laser beam La to fm, the application time for applying power to each laser module 41 that generates the laser beam La to Tpm, and the delay time for each laser module 41 to start application to Tdk. Then, the calculation device 70 calculates, using the following Formulas 11 to 14, the output Pm of each laser module 41, the repetition frequency fm of each laser module 41, the application time Tpm of each laser module 41, and the delay time Tdk of each laser module 41 and stores the calculation results in the storage unit 71. The laser beam machine 1 performs laser machining on the workpiece W under the calculated driving condition.

$$Pm = P/q \quad \text{Formula 11}$$

$$fm = f \times q/n \quad \text{Formula 12}$$

$$Tpm = 1/fm \times D \quad \text{Formula 13}$$

$$Tdk = Td1 + 1/fm \times (k-1), \text{ where } k=1,2,\ldots,q \quad \text{Formula 14}$$

Note that, the delay time Tdk is the time from a falling edge of the clock pulse CP illustrated in FIG. 6 generated by the clock generation circuit until the driving power supplies 43-1, 43-2, 43-3, and 43-4 associated with the laser modules 41-1, 41-2, 41-3, and 41-4 start applying power, that is, the time from a falling edge of the clock pulse CP until the laser modules 41-1, 41-2, 41-3, and 41-4 start generating the laser beams La. The time difference between the laser modules 41-1, 41-2, 41-3, and 41-4 for the laser beams La to start to be generated is calculated as Tpm/D from Formulas 13 and 14, and this time difference Tpm/D results in a time difference according to the repetition frequency f based on Formula 12.

FIG. 6 illustrates the temporal relationship between the clock pulse CP in the high-frequency pulse mode and the pulsed laser beams La generated by the laser modules 41-1, 41-2, 41-3, and 41-4 in order indicated in the power-supplying order information OI illustrated in FIG. 4. According to Formula 14, when the delay time of the first laser module 41-1 is Td1, the delay time Td2 of the second laser module 41-2 is Td1+1/fm, the delay time Td3 of the third laser module 41-3 is Td1+1/fm×2, and the delay time Td4 of the fourth laser module 41-4 is Td1+1/fm×3.

As described above, when the repetition frequency f of the laser beam L defined in the machining condition exceeds the maximum repetition frequency fm(max) of each of the laser modules 41-1, 41-2, 41-3, and 41-4, the calculation device 70 calculates the driving condition for causing two or more laser modules 41 among the laser modules 41-1, 41-2, 41-3, and 41-4 to generate laser beams La with the time difference Tpm/D according to the repetition frequency f defined in the machining condition so as to generate the laser beam L at the repetition frequency f defined in the machining condition. All the laser modules 41-1, 41-2, 41-3, and 41-4 sequentially generate the laser beams La in FIG. 6, but at least two laser modules 41 are only required to sequentially generate laser beams La in the present invention. In the high-frequency pulse mode, the calculation device 70 causes the driving power supplies 43 to supply power in accordance with the calculated machining condition.

When determining, in step ST4, that Formula 4 is satisfied (step ST4: Yes), the calculation device 70 sets the determination output of output laser module number of the light source device 40 to Ps and determines whether or not the following Formula 15 is satisfied (step ST10).

$$P < Ps \quad \text{Formula 15}$$

When determining that Formula 15 is satisfied (step ST10: Yes), the calculation device 70 calculates the driving condition for a low-output continuous wave (CW) mode (step ST11). The low-output CW mode is a mode in which, when the duty ratio D defined in the machining condition is 100%, two or more laser modules 41 among the laser modules 41-1, 41-2, 41-3, and 41-4 are caused to sequentially generate laser beams La, and the timing for one of the two or more laser modules 41 to stop generating the laser beam La is synchronized with the timing for the other laser module 41 to start generating the laser beam La as if a continuous laser beam L is generated. In other words, the low-output CW mode is a mode for matching the timing for one laser module 41 to stop generating the laser beam La with the timing for the other laser module 41 to start generating the laser beam La to realize the laser beam L having the duty ratio D of 100% defined in the machining condition.

In step ST11, the calculation device 70 sets the order of power supply to the laser modules 41 to the order indicated in the power-supplying order information OI. In step ST11, the calculation device 70 sets the temperature time constant of the semiconductor lasers 411 to τ, calculates the output Pm of each of the laser modules 41-1, 41-2, 41-3, and 41-4, the application time Tpm of each of the laser modules 41-1, 41-2, 41-3, and 41-4, and the delay time Tdk of each of the laser modules 41-1, 41-2, 41-3, and 41-4 using the following Formulas 16 to 18, and stores the calculation results in the storage unit 71. Then, the laser beam machine 1 performs laser machining on the workpiece W under the calculated driving condition.

$$Pm = P \quad \text{Formula 16}$$

$$Tpm = \beta \times \tau, \text{ where } \beta \text{ is a safety factor} \quad \text{Formula 17}$$

$$Tdk = Td1 + \beta \times \tau \times (k-1), \text{ where } k=1,2,\ldots,n \quad \text{Formula 18}$$

The time difference for causing the laser modules 41-1, 41-2, 41-3, and 41-4 to start generating the laser beams La in the low-output CW mode is Tpm from Formulas 17 and 18.

FIG. 8 illustrates the temporal relationship between the clock pulse CP in the low-output CW mode and the pulsed laser beams La generated by the laser modules 41-1, 41-2, 41-3, and 41-4 in order indicated in the power-supplying order information OI illustrated in FIG. 4. When the delay time of the first laser module 41-1 is Td1, the delay time Td2 of the second laser module 41-2 is Td1+β×τ, the delay time Td3 of the third laser module 41-3 is Td1+β×τ×2, and the delay time Td4 of the fourth laser module 41-4 is Td1+β×τ×3.

As described above, when the duty ratio D defined in the machining condition is 100% and the output P of the laser beam L defined in the machining condition is less than the determination output Ps of output laser module number, the calculation device 70 calculates the driving condition for causing two or more laser modules 41 among the laser modules 41-1, 41-2, 41-3, and 41-4 to sequentially generate the laser beams La having the output P and synchronizing the timing for one laser module 41 to stop generating the laser beam La with the timing for the other laser module 41 to start generating the laser beam La. All the laser modules 41 sequentially generate the laser beams La in FIG. 8, but at least two laser modules 41 are only required to sequentially generate the laser beams La in the present invention. In the low-output CW mode, the power-supply control apparatus 80 causes the driving power supplies 43 to supply power in accordance with the machining condition calculated by the calculation device 70.

In the low-output CW mode, the calculation device 70 causes the power-supply control apparatus 80 to control the driving power supplies 43 so that the time difference ΔTpm is, for example, 20 μsec (seconds) or less, the time difference ΔTpm meaning the time length from stoppage of generation of the laser beam La of one laser module 41 until the laser beam La of the other laser module 41 becomes in a state where the laser beam rises 90% from a falling state of 10% or less with respect to a predetermined output level set for the laser beam La. In the low-output CW mode, by setting the time difference ΔTpm to, for example, 20 μsec or less, the laser beam machine 1 can set the distance for which the workpiece W is not irradiated with the laser beam L to 17 μm or less when the relative moving speed between the machining head 20 and the workpiece supporting part 10 by the relative movement part 30 is 50 m/min (minute).

When determining, in step ST10, that Formula 15 is not satisfied (step ST10: No), the calculation device 70 calculates a driving condition for a standard-output CW mode (step ST12). In the standard-output CW mode, when the duty ratio D defined in the machining condition is 100%, all the laser modules 41-1, 41-2, 41-3, and 41-4 of the laser modules 41 are caused to simultaneously generate the laser beams La to generate the continuous laser beam L.

In step ST12, the calculation device 70 calculates the outputs Pm of each of the laser modules 41-1, 41-2, 41-3, and 41-4 using the following Formula 19 and stores the calculation results in the storage unit 71, and the laser beam machine 1 performs laser machining on the workpiece W under the calculated driving condition.

$$Pm=P/n \qquad \text{Formula 19}$$

FIG. 9 illustrates the temporal relationship between the clock pulse CP in the standard-output CW mode and the pulsed laser beams La generated by the laser modules 41-1, 41-2, 41-3, and 41-4. In the standard-output CW mode, all the laser modules 41-1, 41-2, 41-3, and 41-4 are caused to simultaneously generate the laser beams La. In FIG. 9, when the delay time of the first laser module 41-1 is Td1, the delay times of the second laser module 41-2, the third laser module 41-3, and the fourth laser module 41-4 are also Td1, and the output P of the laser beam L generated by the light source device 40 is n×Pm. In the standard-output CW mode, the power-supply control apparatus 80 causes the driving power supplies 43 to supply power in accordance with the machining condition calculated by the calculation device 70.

When determining, in step ST5, that Formula 5 is not satisfied (step ST5: No), the calculation device 70 determines whether or not the following Formula 20 is satisfied (step ST13).

$$P<Ps \qquad \text{Formula 20}$$

When determining that Formula 20 is satisfied (step ST13: Yes), the calculation device 70 calculates a driving condition for a low-output standard pulse mode (step ST14). The low-output standard pulse mode is a mode in which, when the repetition frequency f of the laser beam L defined in the machining condition is equal to or less than the maximum repetition frequency fm(max) at which the laser beams La of the laser modules 41-1, 41-2, 41-3, and 41-4 can be repeatedly generated, two or more laser modules 41 among the laser modules 41-1, 41-2, 41-3, and 41-4 are caused to generate the laser beams La with a time difference according to the repetition frequency f defined in the machining condition. In other words, the low-output standard pulse mode is a mode for generating the laser beam L having the repetition frequency f and the output P defined in the machining condition based on the laser beams La generated with a time difference by two or more laser modules 41 among the laser modules 41-1, 41-2, 41-3, and 41-4.

In step ST14, the calculation device 70 sets the order of power supply to the laser modules 41 to the order indicated in the power-supplying order information OI. In step ST14, the calculation device 70 calculates, using the following Formulas 21 to 24, the output Pm of each laser module 41, the repetition frequency fm of each of the laser modules 41-1, 41-2, 41-3, and 41-4, the application time Tpm of each laser module 41, and the delay time Tdk of each laser module 41 and stores the calculation results in the storage unit 71. Then, the laser beam machine 1 performs laser machining on the workpiece W under the calculated driving condition.

$$Pm=P \qquad \text{Formula 21}$$

$$fm=f/n \qquad \text{Formula 22}$$

$$Tpm=1/fm\times D \qquad \text{Formula 23}$$

$$Tdk=Td1+1/fm\times(k-1), \text{ where } k=1,2,\ldots,n \qquad \text{Formula 24}$$

The time difference between the laser modules 41-1, 41-2, 41-3 and 41-4 to start generating the laser beams La in the low-output standard pulse mode is calculated as Tpm/D from Formulas 23 and 24, and this time difference Tpm/D is a time difference according to the repetition frequency f based on Formula 22.

FIG. 11 illustrates the temporal relationship between the clock pulse CP in the low-output standard pulse mode and the pulsed laser beams La generated by the laser modules 41-1, 41-2, 41-3, and 41-4 in order indicated in the power-supplying order information OI illustrated in FIG. 4. When the delay time of the first laser module 41-1 is Td1, the delay time Td2 of the second laser module 41-2 is Td1+1/fm, the delay time Td3 of the third laser module 41-3 is Td1+1/fm× 2, and the delay time Td4 of the fourth laser module 41-4 is Td1+1/fm×3.

As described above, when the repetition frequency f of the laser beam L defined in the machining condition is equal to or less than the maximum repetition frequency fm(max) of each of the laser modules 41 and the output P of the laser beam L is less than the determination output Ps of output laser module number of the light source device 40, the calculation device 70 calculates the driving condition for causing two or more laser modules 41 among the laser modules 41-1, 41-2, 41-3, and 41-4 to generate the laser beams La with the time difference Tpm/D according to the repetition frequency f defined in the machining condition. All the laser modules 41-1, 41-2, 41-3, and 41-4 generate the laser beams La with the time difference Tpm/D in FIG. 11, but at least two laser modules 41 are only required to generate the laser beams La in the present invention. In the low-output standard pulse mode, the power-supply control apparatus 80 causes the driving power supplies 43 to supply power according to the machining condition calculated by the calculation device 70.

The first embodiment exemplifies that the calculation device 70 sequentially supplies power to the laser modules 41 one by one in the low-output standard pulse mode. However, in the present invention, the calculation device 70 may sequentially supply power to the laser modules 41 more than once per module and cause each laser module 41 to repeatedly generate the laser beam La a predetermined number of times in the low-output standard pulse mode.

When determining, in step ST13, that Formula 20 is not satisfied (step ST13: No), the calculation device 70 calculates a driving condition for a standard-output standard pulse mode (step ST15). The standard-output standard pulse mode is a mode in which, when the repetition frequency f of the laser beam L defined in the machining condition is equal to or less than the maximum repetition frequency fm(max) at which the laser beam La of each of the laser modules 41-1, 41-2, 41-3, and 41-4 can be repeatedly generated and Formula 20 is not satisfied, all the laser modules 41-1, 41-2, 41-3, and 41-4 are caused to simultaneously generate the laser beams La to generate the laser beam L having the repetition frequency f and the output P defined in the machining condition.

In step ST15, the calculation device 70 calculates, using the following Formulas 25 to 27, the output Pm of each of the laser modules 41-1, 41-2, 41-3, and 41-4, the repetition frequency fm of each of the laser modules 41-1, 41-2, 41-3, and 41-4, and the application time Tpm of each of the laser modules 41-1, 41-2, 41-3, and 41-4, and stores the calculation results in the storage unit 71. Then, the laser beam machine 1 performs laser machining on the workpiece W under the calculated driving condition.

$$Pm = P/n \quad \text{Formula 25}$$

$$fm = f \quad \text{Formula 26}$$

$$Tpm = 1/fm \times D \quad \text{Formula 27}$$

FIG. 12 illustrates the temporal relationship between the clock pulse CP in the standard-output standard pulse mode and the pulsed laser beams La generated by the laser modules 41-1, 41-2, 41-3, and 41-4. In the standard-output standard pulse mode, all the laser modules 41-1, 41-2, 41-3, and 41-4 are caused to simultaneously generate the laser beams La, and all the laser modules 41-1, 41-2, 41-3, and 41-4 are caused to simultaneously stop generating the laser beams La.

In FIG. 12, when the delay time of the first laser module 41-1 is Td1, the delay times of the second laser module 41-2, the third laser module 41-3, and the fourth laser module 41-4 are also Td1, and the output P of the laser beam L generated by the light source device 40 is n×Pm. In the standard-output standard pulse mode, the power-supply control apparatus 80 causes the driving power supplies 43 to supply power according to the machining condition calculated by the calculation device 70.

After calculating the driving condition for the high-frequency pulse mode, the low-output CW mode, a standard-output CW mode, the low-output standard pulse mode, and the standard-output standard pulse mode (steps ST9, ST11, ST12, ST14, and ST15), the calculation device 70 determines whether the last beam-off timing has ended (step ST20). When determining that the last beam-off timing has not ended (step ST20: No), the calculation device 70 repeats the step ST20. When determining that the last beam-off timing has ended (step ST20: Yes), the calculation device 70 causes the storage unit 71 to store the integrated laser-output time that is a time amount for which the laser beam La of each of the laser modules 41 is generated, rearranges the identification numbers of the laser modules 41 in ascending order of the integrated laser-output times to generate new power-supplying order information OI, records the new power-supplying order information OI in the storage unit 71 (step ST21), and terminates the flowchart illustrated in FIG. 5.

Figure 13:
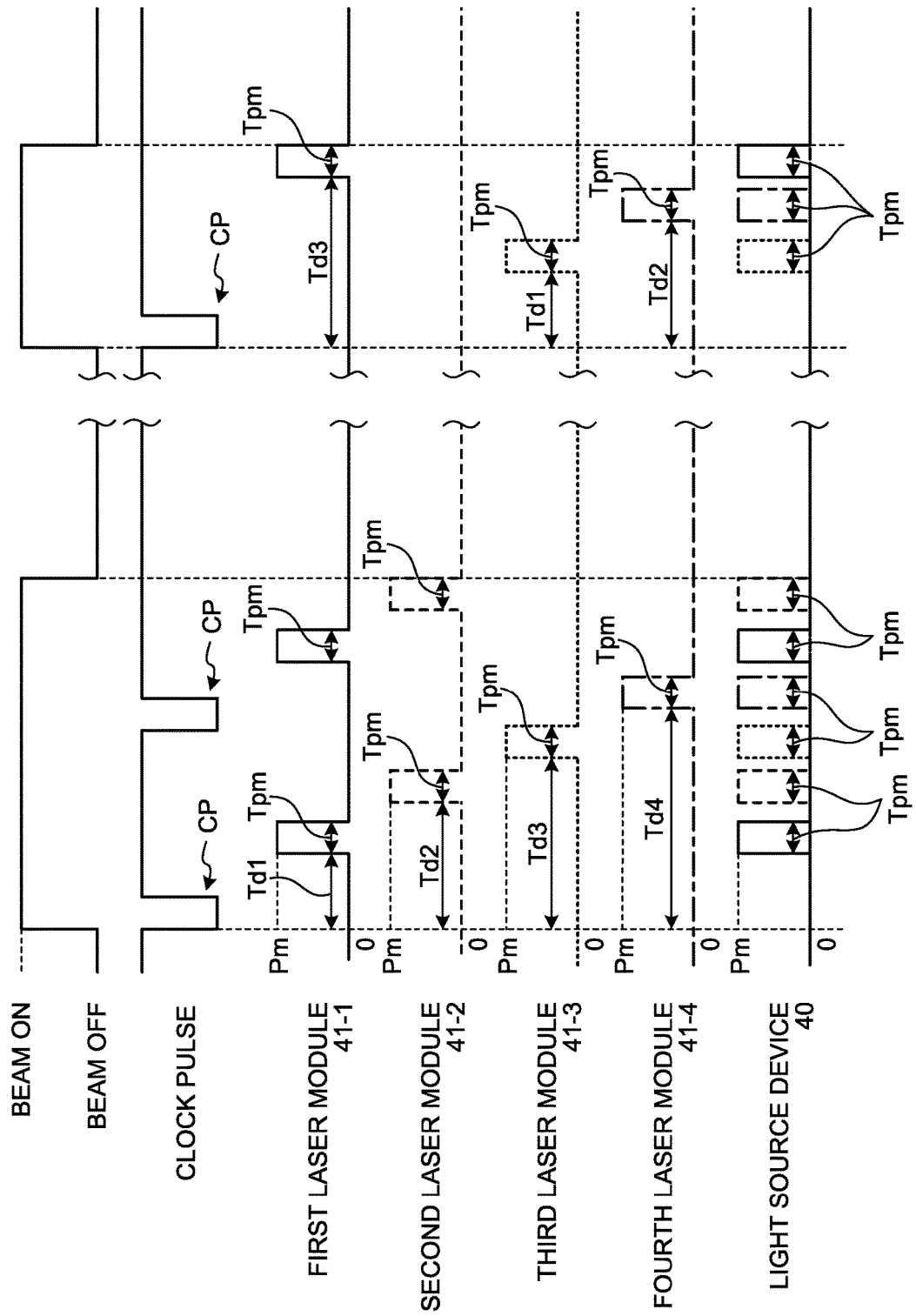
FIG. 13 is a chart illustrating a driving condition for a high-frequency pulse mode calculated by the calculation apparatus of the laser beam machine according to the first embodiment based on the power-supplying order information illustrated in FIG. 4.
Figures 14, 15:
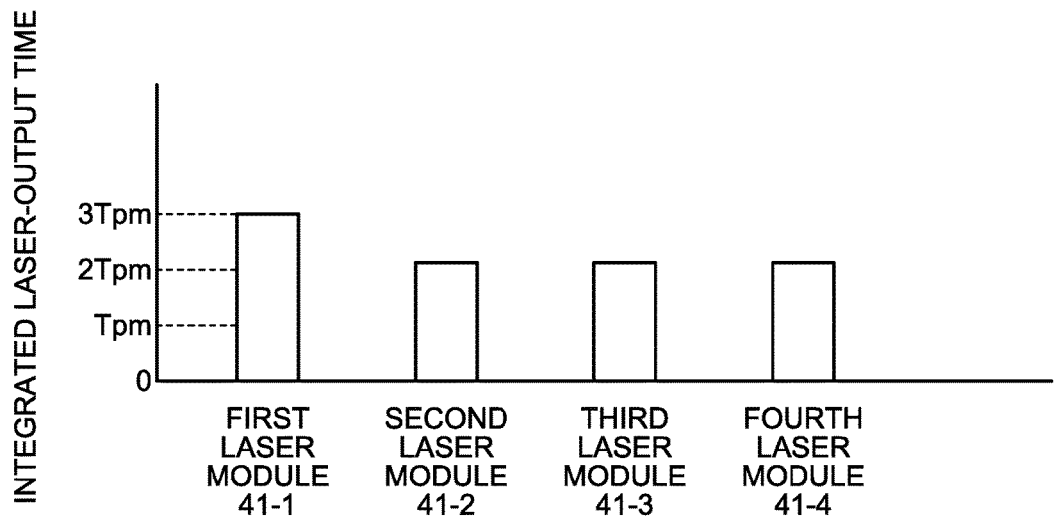
FIG. 14 is a graph illustrating integrated laser-output times of the laser modules to which power is supplied under the driving condition illustrated in FIG. 13.
FIG. 15 is a diagram illustrating power-supplying order information in which identification numbers are rearranged based on the integrated laser-output times illustrated in FIG. 14

Next, the process in which the calculation device 70 according to the first embodiment averages the power supply to the laser modules 41, that is, reduces the differences in output among the laser beams La generated by the laser modules 41 is described with reference to the drawings. FIG. 13 is a chart illustrating the driving condition for the high-frequency pulse mode calculated by the calculation device of the laser beam machine according to the first embodiment based on the power-supplying order information illustrated in FIG. 4. FIG. 14 is a graph illustrating the integrated laser-output times of the laser modules to which power is supplied under the driving condition illustrated in FIG. 13. FIG. 15 is a diagram illustrating the power-supplying order information in which the identification numbers are rearranged based on the integrated laser-output times illustrated in FIG. 14.

In step ST9, the calculation device 70 calculates the driving condition illustrated in FIG. 13, and the laser beam machine 1 performs laser machining on the workpiece W. In the following description of the process for averaging the power supply, that is, the process for reducing the differences in output of the laser beams La generated by the laser modules 41, the unit time of the application time for which power is supplied to each laser module 41 is Tpm. In the following description of the process for averaging the power supply, that is, the process for reducing the differences in output of the laser beams La generated by the laser modules 41, the integrated laser-output time of each laser module 41 before laser machining is performed in accordance with the driving condition illustrated in FIG. 13 is zero.

Since the driving condition illustrated in FIG. 13 is calculated based on the power-supplying order information OI illustrated in FIG. 4, the power is sequentially supplied to the first laser module 41-1, the second laser module 41-2, the third laser module 41-3, and the fourth laser module 41-4 in this order. In the driving condition illustrated in FIG. 13, the first laser module 41-1 is supplied three times with the power the output of which is Pm for the application time Tpm, the second laser module 41-2 is supplied twice with the power the output of which is Pm for the application time Tpm, the third laser module 41-3 is supplied twice with the power the output of which is Pm for the application time Tpm, and the fourth laser module 41-4 is supplied twice with the power the output of which is Pm for the application time Tpm.

In step ST21, the calculation device 70 calculates, as illustrated in FIG. 14, the integrated laser-output times of the laser modules 41 based on the driving condition illustrated in FIG. 13 and records the integrated laser-output times in the storage unit 71. In step ST21, the calculation device 70 further rearranges the identification numbers in ascending order of the integrated laser-output times based on the integrated laser-output times of the laser modules 41 illustrated in FIG. 14 to generate new power-supplying order information OI' illustrated in FIG. 15 and records the information in the storage unit 71. When generating the new power-supplying order information OI', since the integrated laser-output times of the second, third, and fourth laser modules 41-2, 41-3, and 41-4 are equal to each other and shorter than the integrated laser-output time of the first laser module 41-1, the calculation device 70 sets the identification number of the second laser module 41-2 to "1", the identification number of the third laser module 41-3 to "2", the identification number of the fourth laser module 41-4 to "3", and the identification number of the first laser module 41-1 to "4".

Figure 16:
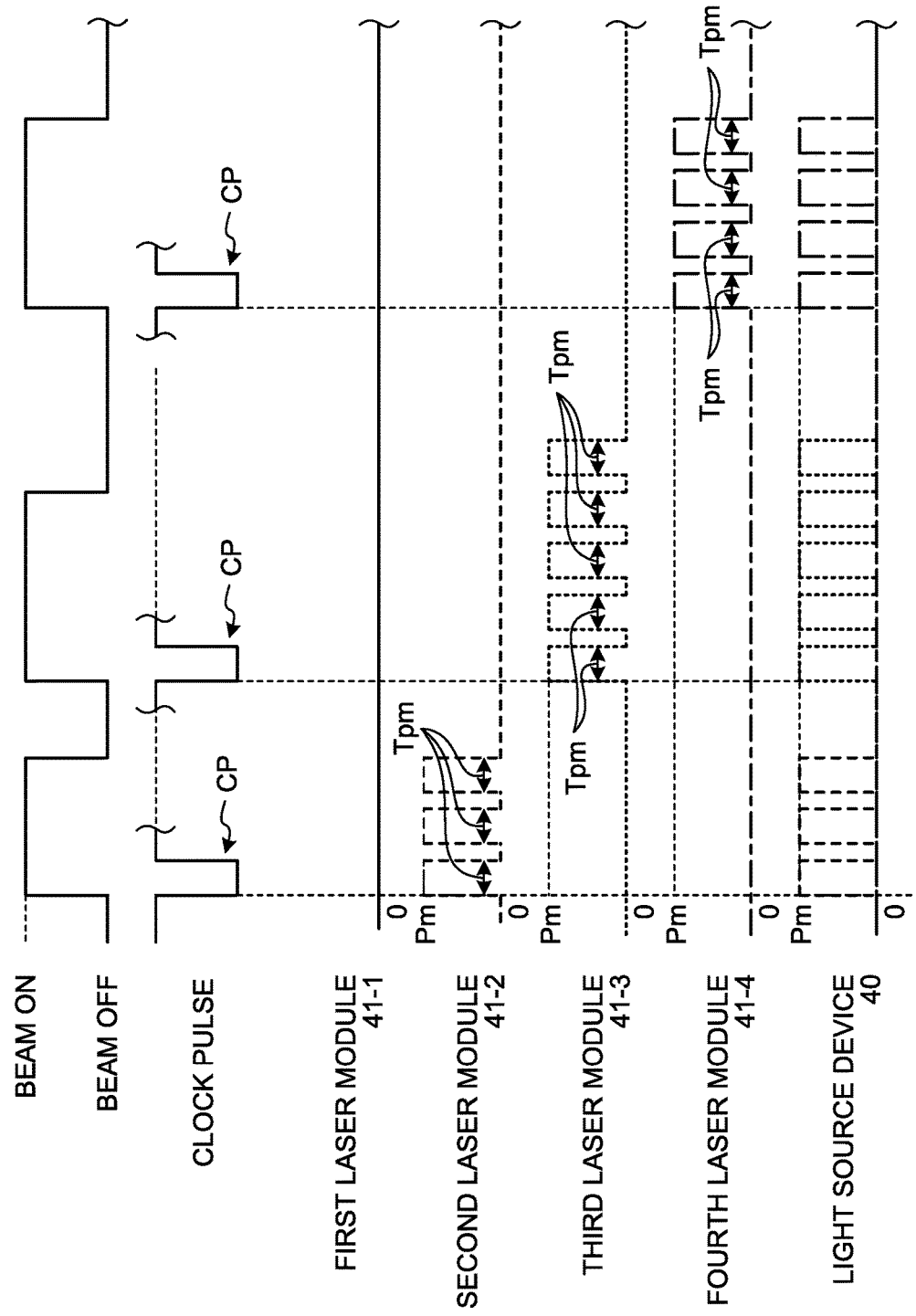
FIG. 16 is a chart illustrating a driving condition for a low-output standard pulse mode calculated by the calculation apparatus of the laser beam machine according to the first embodiment based on the power-supplying order information illustrated in FIG. 15.
Figures 17, 18:
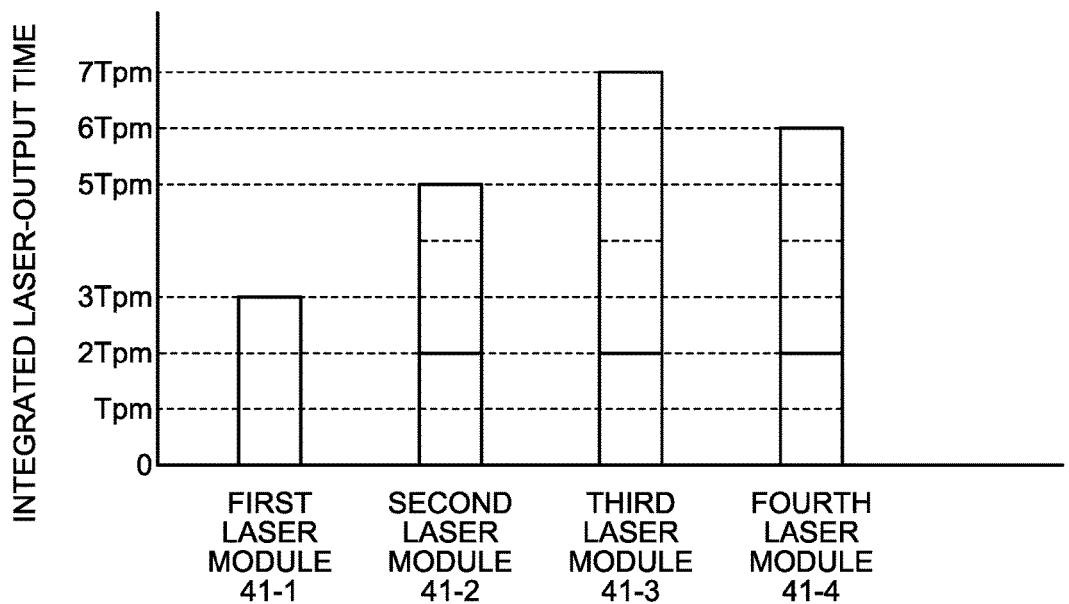
FIG. 17 is a graph illustrating integrated laser-output times of the laser modules to which power is supplied under the driving condition illustrated in FIG. 16.
FIG. 18 is a diagram illustrating power-supplying order information in which identification numbers are rearranged based on the integrated laser-output times illustrated in FIG. 17.

After the laser machining performed in accordance with the driving condition illustrated in FIG. 13 is completed, the calculation device 70 calculates the driving condition for the low-output standard pulse mode illustrated in FIG. 16 and deals with a case where the laser beam machine 1 performs laser machining on the workpiece W in accordance with the driving conditions illustrated in FIG. 16. FIG. 16 is a chart illustrating the driving condition for the low-output standard pulse mode calculated by the calculation device of the laser beam machine according to the first embodiment based on the power-supplying order information illustrated in FIG. 15. FIG. 17 is a graph illustrating the integrated laser-output times of the laser modules to which power is supplied under the driving condition illustrated in FIG. 16. FIG. 18 is a diagram illustrating power-supplying order information in which the identification numbers are rearranged based on the integrated laser-output times illustrated in FIG. 17.

In step ST14, the calculation device 70 calculates the driving condition illustrated in FIG. 16, and the laser beam machine 1 performs laser machining on the workpiece W. Since the driving condition illustrated in FIG. 16 is calculated based on the power-supplying order information OI' illustrated in FIG. 15, the power is sequentially supplied to the second laser module 41-2, the third laser module 41-3, the fourth laser module 41-4, and the first laser module 41-1 in this order. In the driving condition illustrated in FIG. 16, the same laser module 41 is caused to generate the laser beam L for a period from each beam-on timing to the beam-off timing. In the driving condition illustrated in FIG. 16, the second laser module 41-2 is supplied three times with the power the output of which is Pm for the application time Tpm, the third laser module 41-3 is supplied five times with the power the output of which is Pm for the application time Tpm, and the fourth laser module 41-4 is supplied four times with the power the output of which is Pm for the application time Tpm.

In step ST21, the calculation device 70 calculates, as illustrated in FIG. 17, the integrated laser-output times of the laser modules 41 based on the driving condition illustrated in FIG. 16 and records the integrated laser-output times in the storage unit 71. In step ST21, the calculation device 70 further rearranges the identification numbers in ascending order of the integrated laser-output times based on the integrated laser-output times of the laser modules 41 illustrated in FIG. 17 to generate new power-supplying order information OI" illustrated FIG. 18 and records the information in the storage unit 71. When generating the new power-supplying order information OI", since the integrated laser-output times of the first laser module 41-1, the second laser module 41-2, the fourth laser module 41-4, and the third laser module 41-3 become longer in this order, the calculation device 70 sets the identification number of the first laser module 41-1 to "1", the identification number of the second laser module 41-2 to "2", the identification number of the fourth laser module 41-4 to "3", and the identification number of the third laser module 41-3 to "4".

Figure 19:
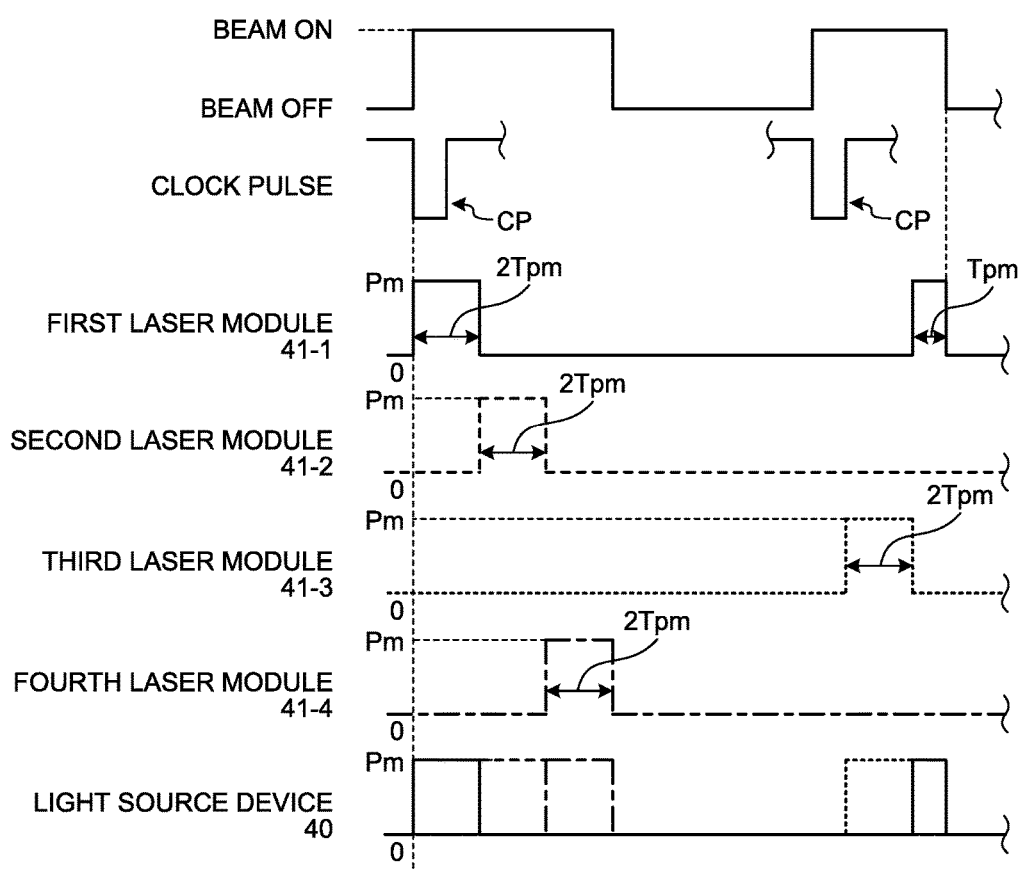
FIG. 19 is a graph illustrating a driving condition for a low-output CW mode calculated by the calculation apparatus of the laser beam machine according to the first embodiment based on the power-supplying order information illustrated in FIG. 18.
Figures 20, 21:
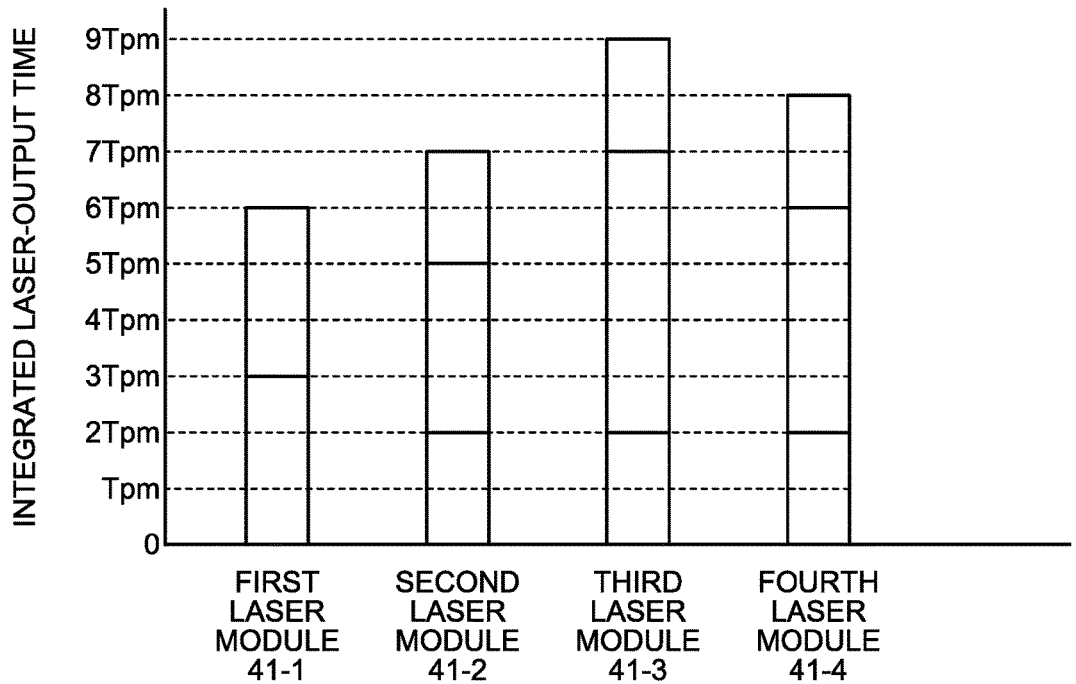
FIG. 20 is a graph illustrating the integrated laser-output times of the laser modules to which power is supplied under the driving condition illustrated in FIG. 19.
FIG. 21 is a diagram illustrating power-supplying order information in which identification numbers are rearranged based on the integrated laser-output times illustrated in FIG. 20.

After the laser machining performed according to the driving condition illustrated in FIG. 16 is completed, the calculation device 70 calculates the driving condition for the low-output CW mode illustrated in FIG. 19 and deals with a case where the laser beam machine 1 performs laser machining on the workpiece W according to the driving condition illustrated in FIG. 19. FIG. 19 is a chart illustrating the driving condition for the low-output CW mode calculated by the calculation device of the laser beam machine according to the first embodiment based on the power-supplying order information illustrated in FIG. 18. FIG. 20 is a graph illustrating the integrated laser-output times of the laser modules to which power is supplied under the driving condition illustrated in FIG. 19. FIG. 21 is a diagram illustrating power-supplying order information in which the identification numbers are rearranged based on the integrated laser-output times illustrated in FIG. 20.

In step ST11, the calculation device 70 calculates the driving condition illustrated in FIG. 19, and the laser beam machine 1 performs laser machining on the workpiece W. Since the driving condition illustrated in FIG. 19 is calculated based on the power-supplying order information OI" illustrated in FIG. 18, the power is sequentially supplied to the first laser module 41-1, the second laser module 41-2, the fourth laser module 41-4, and the third laser module 41-3 in this order. In the driving condition illustrated in FIG. 19, the first laser module 41-1 is supplied once with the power the output of which is Pm for the application time 2Tpm and once with the power the output of which is Pm for the application time Tpm, the second laser module 41-2 is supplied once with the power the output of which is Pm for the application time 2Tpm, the third laser module 41-3 is supplied once with the power the output of which is Pm for the application time 2Tpm, and the fourth laser module 41-4 is supplied once with the power the output of which is Pm for the application time 2Tpm.

In step ST21, the calculation device 70 calculates, as illustrated in FIG. 20, the integrated laser-output times of the laser modules 41 based on the driving condition illustrated in FIG. 19 and records the integrated laser-output times in the storage unit 71. In step ST21, the calculation device 70 further rearranges the identification numbers in ascending order of the integrated laser-output times based on the integrated laser-output times of the laser modules 41 illustrated in FIG. 20 to generate new power-supplying order information OI''' illustrated FIG. 21 and records the information in the storage unit 71. When generating the new power-supplying order information OI''', since the integrated laser-output times of the first laser module 41-1, the second laser module 41-2, the fourth laser module 41-4, and the third laser module 41-3 become longer in this order, the calculation device 70 sets the identification number of the first laser module 41-1 to "1", the identification number of the second laser module 41-2 to "2", the identification number of the fourth laser module 41-4 to "3", and the identification number of the third laser module 41-3 to "4".

As described above, in the calculation device 70 of the laser beam machine 1 according to the first embodiment, there is a difference in the integrated laser-output times of the laser modules 41 illustrated in FIG. 17; the difference in the integrated laser-output times amounts to 4Tpm at the maximum between the first laser module 41-1 and the third laser module 41-3. However, by rearranging the identification numbers of the laser modules 41 in step ST21, the calculation apparatus 70 of the laser beam machine 1 according to the first embodiment can reduce the difference in the integrated laser-output times between the first laser module 41-1 and the third laser module 41-3 to 3Tpm as illustrated in FIG. 20. As described above, by rearranging the identification numbers of the laser modules 41 in step ST21, the calculation device 70 of the laser beam machine 1 according to the first embodiment average the power supply to the laser modules 41 and control the timings for supplying power to the laser modules 41 of the power-supply control apparatus 80 so that the differences in the integrated laser-output times of the laser beams La generated by the laser modules 41 are reduced.

Since the laser beam machine 1 and the calculation device 70 according to the first embodiment control the power-supply control apparatus 80 so that the power supply to the laser modules 41 is averaged and the differences in the integrated laser-output times of the laser beams La generated by the laser modules 41 are reduced, it is possible to reduce the difference in the frequency of power supply between the laser module 41 to which the most amount of power is supplied and the laser module 41 to which the least amount of power is supplied. As a result, it is possible for the laser beam machine 1 and the calculation device 70 according to the first embodiment to curb aged deterioration of a particular laser module 41.

Furthermore, since the laser beam machine 1 and the calculation device 70 according to the first embodiment assign identification numbers to the laser modules 41 and set the order of power supply to the laser modules 41 to the order of the identification numbers of the laser modules 41, it is possible to average the power supply to the laser modules 41.

Since the laser beam machine 1 and the calculation device 70 according to the first embodiment rearrange the identification numbers of the laser modules 41 in ascending order of the integrated laser-output times, it is possible to control the power-supply control apparatus 80 so that the power supply to the laser modules 41 is averaged and the differences in output of the laser beams La generated by the laser modules 41 are lessened.

When the repetition frequency f of the laser beam L defined in the machining condition exceeds the maximum repetition frequency fm(max) at which each of the laser beams La of the laser modules 41-1, 41-2, 41-3, and 41-4 can be repeatedly generated, the laser beam machine 1 and the calculation device 70 according to the first embodiment calculate the driving condition for causing two or more laser modules 41 among the laser modules 41-1, 41-2, 41-3, and 41-4 to generate the laser beams La with the time difference Tpm/D according to the repetition frequency f. The laser beam machine 1 and the calculation device 70 according to the first embodiment carry out the high-frequency pulse mode.

For this, it is possible for the laser beam machine 1 and the calculation device 70 according to the first embodiment to irradiate the workpiece W with the laser beam L at the repetition frequency f exceeding the maximum repetition frequency fm(max) of each of the laser modules 41-1, 41-2, 41-3, and 41-4. As a result, when the laser beam machine 1 and the calculation device 70 according to the first embodiment irradiate the workpiece W with the laser beam L at the repetition frequency f exceeding the maximum repetition frequency fm(max) of each of the laser modules 41-1, 41-2, 41-3, and 41-4, since the wavelengths of the laser beams La generated by the laser modules 41-1, 41-2, 41-3, and 41-4 are equal and the two or more laser modules 41 are caused to generate the laser beams La with the time difference Tpm/D, it is possible to average the power supply to the laser modules 41 and to curb aged deterioration of a particular laser module 41.

When the duty ratio D of the laser beam L defined in the machining condition is 100%, the laser beam machine 1 and the calculation device 70 according to the first embodiment calculates the driving condition for causing two or more laser modules 41 among the laser modules 41-1, 41-2, 41-3, and 41-4 to sequentially generate the laser beams La and synchronizing the timing for one of the two or more laser modules 41 to stop generating the laser beam La with the timing for the other laser module 41 to start generating the laser beam La. The laser beam machine 1 and the calculation device 70 according to the first embodiment perform the low-output CW mode.

For this, since the laser beam machine 1 and the calculation device 70 according to the first embodiment cause the laser modules 41-1, 41-2, 41-3, and 41-4 to sequentially generate the laser beams La to generate the laser beam L having the duty ratio D of 100%, it is possible to consecutively irradiate the workpiece W with the laser beams La having a low level output P. Furthermore, since the laser beam machine 1 and the calculation device 70 according to the first embodiment perform the low-output CW mode when the duty ratio D is 100% and the output P of the laser beam L defined in the machining condition is less than the determination output Ps of output laser module number, the laser beam L having the output P less than the determination output Ps of output laser module number is formed by the laser beam La generated by one laser module 41.

As a result, it is possible for the laser beam machine 1 and the calculation device 70 according to the first embodiment to stably consecutively irradiate the workpiece W with the laser beam L having the output P less than the determination output Ps of output laser module number, to stably perform scribing processing that is an example of low-output laser machining, and to curb deterioration in the reliability of laser machining.

In addition, since the laser beam machine 1 and the calculation device 70 according to the first embodiment cause two or more laser modules 41 to generate the laser beams La with the time difference ΔTpm in the low-output CW mode, it is possible to average the power supply to the laser modules 41. As a result, it is possible for the laser beam machine 1 and the calculation device 70 according to the first embodiment to suppress deterioration in the reliability of laser machining and aged deterioration of a particular laser module 41.

Furthermore, in the low-output CW mode, the laser beam machine 1 and the calculation device 70 according to the first embodiment cause the power-supply control apparatus 80 to control the driving power supplies 43 so that the time difference ΔTpm from stoppage of generation of the laser beam La of one laser module 41 until the other laser module 41 starts generating the laser beam La is 20 μsec or less. For this reason, it is possible for the laser beam machine 1 and the calculation device 70 according to the first embodiment to reduce the distance for which the workpiece W is not irradiated with the laser beam L, to stably perform scribing processing, which is an example of low-output laser machining, and to prevent deterioration in the reliability of laser machining, in the low-output CW mode.

In addition, in the laser beam machine 1 and the calculation device 70 according to the first embodiment, the application time Tpm satisfies Formula 17, and the time for which power is applied to the laser modules 41 is adequately longer than the time constant τ of the semiconductor laser 411 in the low-output CW mode. For this reason, it is possible for the laser beam machine 1 and the calculation device 70 according to the first embodiment to suppress the temperature change of each laser module 41 and to curb deterioration in the lifetime of each laser module 41.

Furthermore, when the repetition frequency f of the laser beam L defined in the machining condition is equal to or less than the maximum repetition frequency fm(max) at which the laser beams La of the laser modules 41-1, 41-2, 41-3, and 41-4 can be repeatedly generated, the laser beam machine 1 and the calculation device 70 according to the first embodiment calculate the driving condition for causing two or more laser modules 41 among the laser modules 41-1, 41-2, 41-3, and 41-4 to generate the laser beams La with the time difference Tpm/D according to the repetition frequency f. The laser beam machine 1 and the calculation device 70 according to the first embodiment perform the low-output standard pulse mode.

For this, when the repetition frequency f is equal to or less than the maximum repetition frequency fm(max), the laser beam machine 1 and the calculation device 70 according to the first embodiment cause the laser modules 41 to sequentially generate the laser beams La, and so it is possible to irradiate the workpiece W with the pulsed laser beam La having a low level output P. Furthermore, since the laser beam machine 1 and the calculation device 70 according to the first embodiment perform the low-output standard pulse mode when the repetition frequency f is equal to or less than the maximum repetition frequency fm(max) and the output P of the laser beam L defined in the machining condition is less than the determination output Ps of output laser module number, the laser beam L having the output P less than the determination output Ps of output laser module number is formed by the laser beam La generated by one laser module 41.

As a result, it is possible for the laser beam machine 1 and the calculation device 70 according to the first embodiment to stably irradiate the workpiece W with the laser beam L having the output P less than the determination output Ps of output laser module number, to stably perform scribing processing, which is an example of low-output laser machining, and to suppress deterioration in the reliability of laser machining.

In addition, since the laser beam machine 1 and the calculation device 70 according to the first embodiment cause two or more laser modules 41 to generate the laser beams La with the time difference Tpm/D in the low-output standard pulse mode, it is possible to average the power supply to the laser modules 41. As a result, it is possible for the laser beam machine 1 and the calculation device 70 according to the first embodiment to suppress deterioration in the reliability of laser machining and aged deterioration of a particular laser module 41.

Second Embodiment

Figures 22, 23:
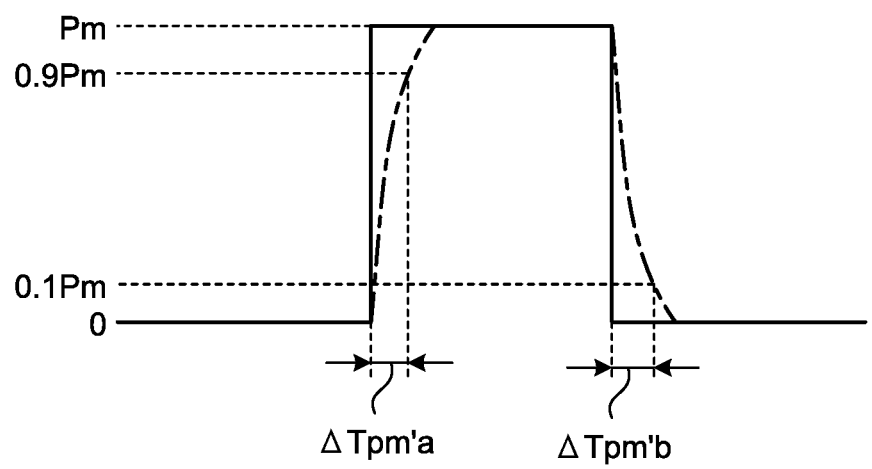
FIG. 22 is a diagram illustrating an example of power-supplying order information stored in the storage unit of the calculation apparatus of the laser beam machine according to a second embodiment.
FIG. 23 is a chart illustrating the time required for each laser module of the laser beam machine according to a third embodiment to reach the output defined in a machining condition.

Next, the laser beam machine 1 according to a second embodiment of the present invention is described with reference to the drawings. FIG. 22 is a diagram illustrating an example of the power-supplying order information stored in the storage unit of the calculation device of the laser beam machine according to the second embodiment.

The laser beam machine 1 according to the second embodiment has the same configuration as the configuration in the first embodiment and performs the same processing as in the first embodiment except that power-supplying order information OI-2 stored in the storage unit 71 of the calculation device 70 is different from the first embodiment.

The power-supplying order information OI-2 stored in the storage unit 71 of the calculation device 70 of the laser beam machine 1 according to the second embodiment associates the identification numbers of the laser modules 41 with the unique numbers of the laser modules 41 on a one-to-one basis. The identification numbers of the laser modules 41 in the power-supplying order information OI-2 illustrated in FIG. 22 are arranged in ascending order of accumulated laser-output energies. After the last beam-off timing ends, the calculation unit 72 of the calculation device 70 calculates the accumulated laser-output energy of each of the laser modules 41, records it in the storage unit 71, rearranges the identification numbers of the laser modules 41 in ascending order of the accumulated laser-output energies to generate new power-supplying order information OI-2, and records the new power-supplying order information OI-2 in the storage unit 71. In the rearrangement, the calculation unit 72 sequentially gives identification numbers from the smallest number to the laser modules 41 in ascending order of the accumulated laser-output energies. When there are two or more laser modules 41 whose accumulated laser-output energies are equal, the calculation unit 72 gives the smaller identification number to the laser module 41 having the smaller unique number. The accumulated laser-output energy is a value obtained by multiplying the time for which each laser module 41 generates the laser beam La by the output of the laser beam La and accumulating the multiplication results.

Since the calculation device 70 of the laser beam machine 1 according to the second embodiment rearranges the identification numbers of the laser modules 41 in ascending order of the accumulated laser-output energies and controls the timings for supplying power to the laser modules 41 of the power-supply control apparatus 80 so that the differences in the accumulated laser-output energies between the laser beams La generated by the laser modules 41 are reduced, it is possible to average the power supply to the laser modules 41.

Third Embodiment

Next, the laser beam machine 1 according to a third embodiment of the present invention is described with reference to the drawings. FIG. 23 is a chart illustrating the time required for each laser module of the laser beam machine according to the third embodiment to reach the output defined in the machining condition.

The laser beam machine 1 according to the third embodiment has the same configuration as the configuration in the first embodiment except that laser modules 41-1, 41-2, 41-3, and 41-4 are designed so that the time $\Delta$Tpm'a required for each of the laser modules 41-1, 41-2, 41-3, and 41-4 to reach 90% of the output P defined in the machining condition after the power is supplied, and the time $\Delta$Tpm'b required for each of the laser modules 41-1, 41-2, 41-3, and 41-4 to reach 10% of the output P defined in the machining condition after the power supply is stopped are 20 μsec or less. A solid line in FIG. 23 represents the power applied to each laser module 41, and a chain line in FIG. 23 represents the output of the laser beam La.

Similarly to the first embodiment, the laser beam machine 1 and the calculation device 70 according to the third embodiment perform the high-frequency pulse mode, and so it is possible to curb deterioration of a particular laser module 41. Furthermore, similarly to the first embodiment, the laser beam machine 1 and the calculation device 70 according to the third embodiment perform the low-output CW mode and the low-output standard pulse mode, and so it is possible to suppress the deterioration in the reliability of the laser machining and to suppress aged deterioration of a particular laser module 41.

In addition, since the laser modules 41-1, 41-2, 41-3, and 41-4 are designed so that the times $\Delta$Tpm'a and $\Delta$Tpm'b are each 20 μsec or less in the laser beam machine 1 and the calculation device 70 according to the third embodiment, it is possible to set the distance for which the workpiece W is not irradiated with the laser beam L to 17 μm or less when the relative moving speed of the machining head 20 and the workpiece supporting part 10 by the relative movement part 30 is 50 m/min. By this means, it is possible for the laser beam machine 1 and the calculation device 70 according to the third embodiment to reduce the distance for which the workpiece W is not irradiated with the laser beam L in the low-output CW mode, to thereby stably perform scribing processing, which is an example of low-output laser machining, and to prevent deterioration in the reliability of laser machining.

Figure 24:
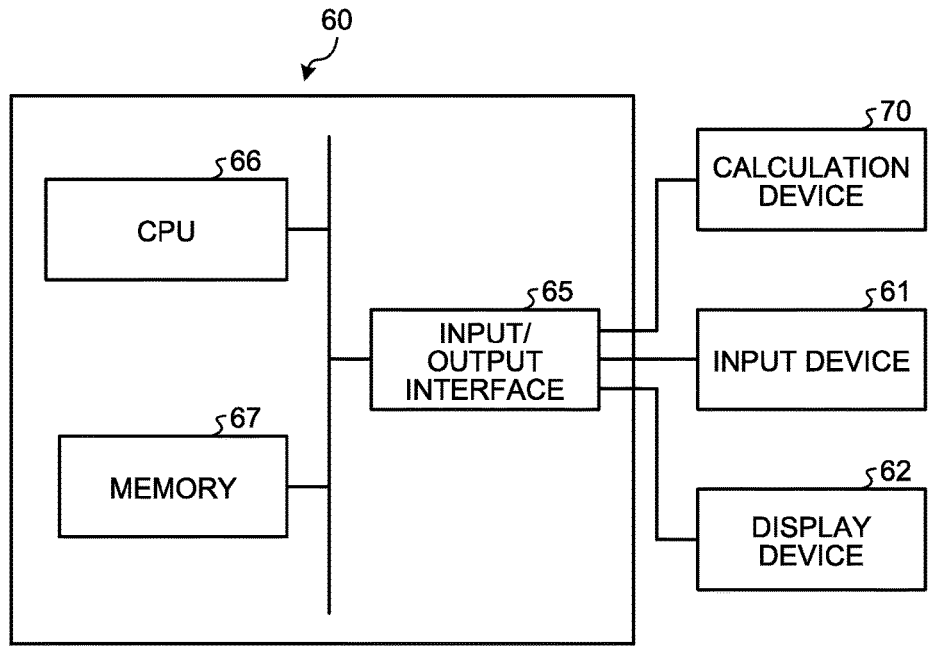
FIG. 24 is a diagram illustrating an example of a hardware configuration of a machine control apparatus of the laser beam machine according to each embodiment.

Next, the configuration of the machine control device 60 of the laser beam machine 1 according to each embodiment is described. FIG. 24 is a diagram illustrating an example of a hardware configuration of the machine control device of the laser beam machine according to each embodiment. The machine control apparatus 60 receives the information about the laser beam machine 1, the position information of each part of the workpiece W, and the machining conditions from the input device 61 connected to an input/output interface 65 illustrated in FIG. 24. The input device 61 is constituted by a touch panel, a keyboard, a mouse, a trackball, or any combination thereof. The machine control device 60 displays the position of each part of the workpiece W on the display device 62 connected to the input/output interface 65. In each embodiment, the display device 62 is a liquid crystal display device, but is not limited to a liquid crystal display device.

As illustrated in FIG. 24, the machine control device 60 is configured to include a computer having a central processing unit (CPU) 66, a memory 67, and the input/output interface 65. The memory 67 stores software, firmware, or a combination of software and firmware as a program. The memory 67 further stores the information about the laser beam machine 1, the position information about the part of the workpiece W, and the machining conditions, which are inputted from the input device 61. The memory 67 is constituted by a nonvolatile or volatile semiconductor memory, a magnetic disk, an optical disk, or a magneto-optical disk. As a nonvolatile or volatile semiconductor memory, a random access memory (RAM), a read only memory (ROM), a flash memory, an erasable programmable read only memory (EPROM), or an electrically erasable programmable read only memory (EEPROM) is used. In the machine control device 60, the CPU 66 executes the program stored in the memory 67 to implement the function of the control unit 64. The machine control device 60 implements the function of the storage unit 63 based on the memory 67.

Figure 25:
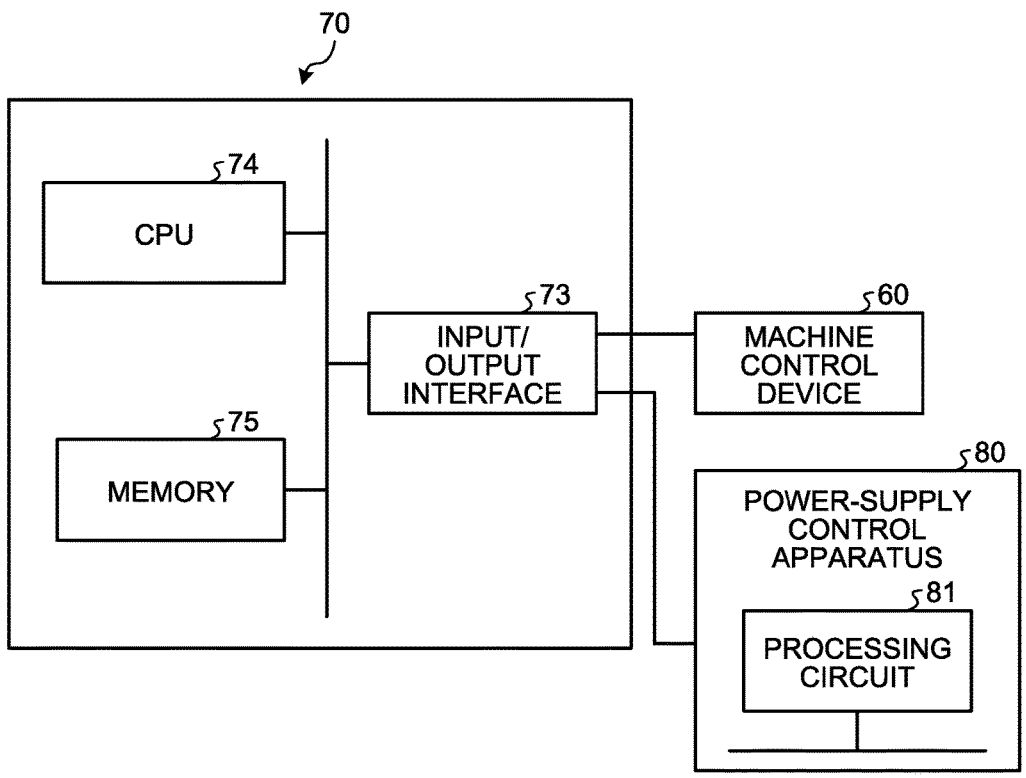
FIG. 25 is a diagram illustrating an example of a hardware configuration of the calculation apparatus of the laser beam machine according to each embodiment.

Next, the configuration of the calculation device 70 of the laser beam machine 1 according to each embodiment is described. FIG. 25 is a diagram illustrating an example of a hardware configuration of the calculation device of the laser beam machine according to each embodiment. The calculation device 70 is capable of communicating with the machine control device 60 and the power-supply control apparatus 80 via the input/output interface 73 illustrated in FIG. 25.

As illustrated in FIG. 25, the calculation device 70 is a computer including a CPU 74, a memory 75, and an input/output interface 73. The memory 75 stores software, firmware, or a combination of software and firmware as a program. The program stored in the memory 75 includes a program for calculating driving conditions. The memory 75 further stores a part of the machining conditions inputted from the input device 61. The memory 75 is constituted by a nonvolatile or volatile semiconductor memory, a magnetic disk, an optical disk, or a magneto-optical disk. As a nonvolatile or volatile semiconductor memory, a RAM, ROM, flash memory, EPROM, or EEPROM is used. In the calculation device 70, the CPU 74 executes the program stored in the memory 76 to implement the function of the calculation unit 72. The calculation device 70 implements the function of the storage unit 71 based on the memory 75.

In each embodiment, the laser beam machine 1 may have a configuration in which the machine control device 60 and the calculation device 70 are constructed by a single computer.

The function of the power-supply control apparatus 80 is implemented by a processing circuit 81 illustrated in FIG. 25 in each embodiment, but may be implemented by a calculation device that executes a program stored in a memory (not illustrated).

When the function of the power-supply control apparatus 80 is implemented by the processing circuit 81, the processing circuit 81 corresponds to a single circuit, a composite circuit, a programmed processor, a parallel-programmed processor, an application specific integrated circuit (ASIC), a field-programmable gate array (FPGA), or any combination thereof.

When the function is implemented by the calculation device, the function of the power-supply control apparatus 80 is implemented by software, firmware, or a combination of software and firmware. Software and firmware are described as programs or a program and stored in a memory. The calculation device implements the function of the power-supply control apparatus 80 by reading and executing the program stored in the memory. It can be said that the program stored in the memory cause the computer to carry out the processing of the power-supply control apparatus 80. Here, the calculation device is a central processing unit (CPU), a processing device, a microprocessor, a microcomputer, a processor, or a digital signal processor (DSP). The memory corresponds to a nonvolatile or volatile semiconductor memory, a magnetic disk, an optical disk, or a magneto-optical disk. The semiconductor memory is a RAM, ROM, flash memory, EPROM, or EEPROM.

The configurations described in the above embodiments are examples of the present invention and can be combined with other publicly known techniques, and can be partially omitted and/or modified without departing from the scope of the present invention.

REFERENCE SIGNS LIST

1 laser beam machine; 41 laser module; 42 combiner (light condensing means); 43 driving power supply; 70 calculation device; 71 storage unit (recording device); 80 power-supply control apparatus; W workpiece; L, La laser beam; P output (machining condition); f repetition frequency (machining condition); D duty ratio (machining condition); Pm output (driving condition); fm repetition frequency (driving condition); Tpm application time (driving condition); Tdk, Td1, Td2, Td3, Td4 delay time (driving condition); fm(max) maximum repetition frequency; Tpm/D time difference.

The invention claimed is:

1. A laser beam machine that irradiates a workpiece with one laser beam to perform laser machining, the laser beam machine comprising:
a plurality of laser modules to generate beams, the laser modules having identification numbers representing an order of generating beams;
a light condenser to condense the beams generated from the laser modules to output the one laser beam;

a plurality of driving power supplies to supply power to the laser modules, respectively;

calculation circuitry to receive a machining condition and to calculate a driving condition for each of the laser modules according to the machining condition; and power-supply control circuitry to cause the driving power supplies to supply power to the laser modules in accordance with the driving condition, wherein the calculation circuitry sets an order of power supply to the laser modules to an order of the identification numbers and rearranges the identification numbers assigned to the laser modules in ascending order of integrated laser-output times of the beams generated by the laser modules to reduce differences in the integrated laser-output times.

2. A laser beam machine that irradiates a workpiece with one laser beam to perform laser machining, the laser beam machine comprising:

a plurality of laser modules to generate beams, the laser modules having identification numbers representing an order of generating the beams;

a light condenser to condense the beams generated from the laser modules to output the one laser beam;

a plurality of driving power supplies to supply power to the laser modules, respectively;

calculation circuitry to receive a machining condition and to calculate a driving condition for each of the laser modules according to the machining condition; and power-supply control circuitry to cause the driving power supplies to supply power to the laser modules in accordance with the driving condition, wherein the calculation circuitry sets an order of power supply to the laser modules to an order of the identification numbers and rearranges the identification numbers assigned to the laser modules in ascending order of accumulated laser-output energies of the beams generated by the laser modules to reduce differences in the accumulated laser-output energies.

3. A laser beam machine that irradiates a workpiece with one laser beam to perform laser machining, the laser beam machine comprising:

a plurality of laser modules to generate beams;

a light condenser to condense the beams generated from the laser modules to output the one laser beam;

a plurality of driving power supplies to supply power to the laser modules, respectively;

calculation circuitry to receive a machining condition and to calculate a driving condition for each of the laser modules according to the machining condition; and power-supply control circuitry to cause the driving power supplies to supply power to the laser modules in accordance with the driving condition, wherein when a repetition frequency of the one laser beam defined in the machining condition exceeds a maximum repetition frequency at which the beams of the laser modules are repeatedly generated, and a repetition frequency of each of the laser modules is equal to or less than the maximum repetition frequency and an output the beams of the laser modules is equal to or less than a maximum output the beams of the laser modules, the calculation circuitry calculates a driving condition for causing two or more laser modules of the plurality of laser modules to generate the beams with a time difference according to the repetition frequency defined in the machining condition and generating the one laser beam at the repetition frequency defined in the machining condition, the time difference being a value obtained by dividing a number of the laser modules by a product of the repetition frequency of the one laser beam defined in the machining condition and the number of the laser modules that generate the beams at the same timing to satisfy the machining condition.

4. The laser beam machine according to claim 3, wherein when the repetition frequency of the one laser beam defined in the machining condition is equal to or less than the maximum repetition frequency at which the beams of the laser modules are repeatedly generated, the calculation circuitry calculates a driving condition for causing two or more laser modules of the plurality of laser modules to generate the beams with a time difference according to the repetition frequency defined in the machining condition.

5. A laser beam machine that irradiates a workpiece with one laser beam to perform laser machining, the laser beam machine comprising:

a plurality of laser modules to generate beams;

a light condenser to condense the beams, generated from the laser modules to output the one laser beam;

a plurality of driving power supplies to supply power to the laser modules, respectively;

calculation circuitry to receive a machining condition and to calculate a driving condition for each of the laser modules according to the machining condition; and power-supply control circuitry to cause the driving power supplies to supply power to the laser modules in accordance with the driving condition, wherein when a duty ratio of the one laser beam defined in the machining condition is 100% and an output of the one laser beam defined in the machining condition is less than a determination output of output laser module number for determining whether the laser simultaneously generate the beams or each laser module generates a corresponding one of the beams at a different timing from the other, the calculation circuitry calculates the driving condition for causing two or more laser modules of the plurality of laser modules to sequentially generate the beams and synchronizing a timing for one of the two or more laser modules of the plurality of laser modules to stop generating a corresponding one of the beams with a timing for the other laser module to start generating a corresponding one of the beams, the determination output of output laser module number being a value obtained by multiplying a minimum output of the laser modules by a number of the laser modules.

6. The laser beam machine according to claim 5, wherein when a repetition frequency of the one laser beam defined in the machining condition is equal to or less than a maximum repetition frequency at which the beams of the laser modules are repeatedly generated, the calculation circuitry calculates the driving condition for causing two or more laser modules of the plurality of laser modules to generate the beams with a time difference according to the repetition frequency defined in the machining condition.

7. Calculation circuitry for a laser beam machine, which calculates a driving condition for each of a number of laser modules according to a machining condition of the laser beam machine that irradiates a workpiece with one laser beam formed by combining a plurality of beams generated by the laser modules, wherein when a repetition frequency of the one laser beam defined in the machining condition exceeds a maximum repetition frequency at which the beams of the laser modules are repeatedly generated, and a repetition frequency of each of the laser modules is equal to or less than the maximum repetition frequency and an output of each of the beams of the laser modules is equal to or less than a maximum output of the laser modules, the calculation circuitry calculates the driving condition for causing two or more laser modules of the number of laser modules to generate the beams with a time difference according to the repetition frequency defined in the machining condition to generate the one laser beam at the repetition frequency defined in the machining condition, the time difference being a value obtained by dividing among the number of laser modules of the laser modules by a product of the repetition frequency of the one laser beam defined in the machining condition and the number of the laser modules that generate the beams at the same timing to satisfy the machining condition.

8. The calculation circuitry for the laser beam machine according to claim 7, wherein
when a duty ratio of the one laser beam defined in the machining condition is 100%, the calculation circuitry calculates the driving condition for causing the two or more laser modules of the number of laser modules to sequentially generate the beams and synchronizing a timing for one of the two or more laser modules of the number of laser modules to stop generating a corresponding one of the beams with a timing for the other laser module to start generating a corresponding one of the beams.

9. The calculation circuitry for the laser beam machine according to claim 8, wherein
when the repetition frequency of the one laser beam defined in the machining condition is equal to or less than the maximum repetition frequency at which the beams of the laser modules are repeatedly generated, the calculation circuitry calculates the driving condition for causing the two or more laser modules of the number of laser modules to generate the beams with a time difference according to the repetition frequency defined in the machining condition.

10. The calculation circuitry for the laser beam machine according to claim 7, wherein
when the repetition frequency of the one laser beam defined in the machining condition is equal to or less than the maximum repetition frequency at which the beams of the laser modules are repeatedly generated, the calculation circuitry calculates the driving condition for causing the two or more laser modules of the number of laser modules to generate the beams with a time difference according to the repetition frequency defined in the machining condition.

11. A calculation circuitry for a laser beam machine, which calculates a driving condition for each of a number of laser modules according to a machining condition of the laser beam machine that irradiates a workpiece with one laser beam formed by combining a plurality of beams generated by the laser modules, wherein
when a duty ratio of the one laser beam defined in the machining condition is 100% and an output of the one laser beam defined in the machining condition is less than a determination output of output laser module number for determining whether the laser modules simultaneously generate the beams or each laser module generates corresponding one of the beams at a different timing, the calculation circuitry calculates the driving condition for causing two or more laser modules of the number of laser modules to sequentially generate the beams and synchronizing a timing for one of the two or more laser modules of the number of laser modules to stop generating a corresponding one of the beams with a timing for the other laser module to start generating a corresponding one of the beams, the determination output of output laser module number being a value obtained by multiplying a minimum output of the laser modules by the number of the laser modules.

12. The calculation circuitry for the laser beam machine according to claim 11, wherein
when a repetition frequency of the one laser beam defined in the machining condition is equal to or less than a maximum repetition frequency at which the beams of the laser modules are repeatedly generated, the calculation circuitry calculates the driving condition for causing the two or more laser modules of the number of laser modules to generate the beams with a time difference according to the repetition frequency defined in the machining condition.

* * * * *